United States Patent
DeDontney et al.

(10) Patent No.: US 10,048,403 B2
(45) Date of Patent: Aug. 14, 2018

(54) METHOD AND SYSTEM FOR GENERATION OF UPSCALED MECHANICAL STRATIGRAPHY FROM PETROPHYSICAL MEASUREMENTS

(71) Applicants: Nora L. DeDontney, Houston, TX (US); Brian R. Crawford, Missouri City, TX (US); Bashar Alramahi, Houston, TX (US)

(72) Inventors: Nora L. DeDontney, Houston, TX (US); Brian R. Crawford, Missouri City, TX (US); Bashar Alramahi, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 1112 days.

(21) Appl. No.: 14/292,452

(22) Filed: May 30, 2014

(65) Prior Publication Data
US 2014/0379312 A1 Dec. 25, 2014

Related U.S. Application Data

(60) Provisional application No. 61/837,488, filed on Jun. 20, 2013.

(51) Int. Cl.
*G06F 7/60* (2006.01)
*G06G 7/48* (2006.01)
(Continued)

(52) U.S. Cl.
CPC .............. *G01V 11/00* (2013.01); *E21B 43/00* (2013.01); *E21B 49/003* (2013.01); *G06F 17/5018* (2013.01)

(58) Field of Classification Search
None
See application file for complete search history.

(56) References Cited

U.S. PATENT DOCUMENTS

| 4,817,062 A | 3/1989 | De Buyl et al. |
| 5,398,215 A | 3/1995 | Sinha et al. |

(Continued)

FOREIGN PATENT DOCUMENTS

| WO | 2004/106699 | 12/2004 |
| WO | 2005/036338 | 4/2005 |

(Continued)

OTHER PUBLICATIONS

Blum, Philipp, Rae Mackay, and Michael S. Riley. "Stochastic simulations of regional scale advective transport in fractured rock masses using block upscaled hydro-mechanical rock property data." Journal of Hydrology 369.3 (2009): 318-325.*

(Continued)

*Primary Examiner* — Aniss Chad
*Assistant Examiner* — Nithya J Moll
(74) *Attorney, Agent, or Firm* — ExxonMobil Upstream Research Company—Law Department

(57) ABSTRACT

Method and system is described for modeling one or more strength properties of a subsurface volume. The method provides an enhanced process for upscaling to simplify data in a manner that accounts for problems with conventional techniques. The method involves simplifying the petrophysical data and/or layers to provide an upscaling approach that accounts for the influences on the strength properties. The properties may then be utilized to enhance a subsurface model and used to enhance hydrocarbon recovery.

15 Claims, 10 Drawing Sheets

(51) Int. Cl.
*G01V 11/00* (2006.01)
*E21B 43/00* (2006.01)
*G06F 17/50* (2006.01)
*E21B 49/00* (2006.01)

(56) References Cited

U.S. PATENT DOCUMENTS

| | | |
|---|---|---|
| 5,416,697 A | 5/1995 | Goodman |
| 5,442,950 A | 8/1995 | Unalmiser et al. |
| 5,475,650 A | 12/1995 | Sinha et al. |
| 5,485,431 A | 1/1996 | Johnson et al. |
| 5,521,882 A | 5/1996 | D'Angelo et al. |
| 5,544,127 A | 8/1996 | Winkler |
| 5,619,475 A | 4/1997 | Winkler |
| 5,741,971 A | 4/1998 | Lacy |
| 5,767,399 A | 6/1998 | Smith et al. |
| 6,098,021 A | 8/2000 | Tang et al. |
| 6,302,221 B1 | 10/2001 | Hamman et al. |
| 6,386,297 B1 | 5/2002 | Cooley et al. |
| 6,654,692 B1 | 11/2003 | Neff |
| 6,662,109 B2 | 12/2003 | Roggero et al. |
| 6,718,265 B2 | 4/2004 | Herron et al. |
| 6,941,231 B2 | 9/2005 | Zeroug et al. |
| 7,066,019 B1 | 6/2006 | Papanastasiou |
| 7,133,779 B2 | 11/2006 | Tilke et al. |
| 7,181,380 B2 | 2/2007 | Dusterhoft |
| 7,357,196 B2 | 4/2008 | Goldman et al. |
| 7,373,251 B2 | 5/2008 | Hamman et al. |
| 7,404,456 B2 | 7/2008 | Weaver et al. |
| 7,412,331 B2 | 8/2008 | Calhoun et al. |
| 7,472,022 B2 | 12/2008 | Birchwood |
| 7,526,385 B2 | 4/2009 | Sayers |
| 7,539,625 B2 | 5/2009 | Klumpen et al. |
| 7,546,884 B2 | 6/2009 | Veeningen et al. |
| 7,548,873 B2 | 6/2009 | Veeningen et al. |
| 7,555,414 B2 | 6/2009 | Calhoun et al. |
| 7,603,265 B2 | 10/2009 | Mainguy et al. |
| 7,649,804 B2 | 1/2010 | Sinha |
| 7,650,241 B2 | 1/2010 | Jogi et al. |
| 7,953,587 B2 | 5/2011 | Bratton et al. |
| 7,991,554 B2 | 8/2011 | Calhoun et al. |
| 8,150,667 B2 | 4/2012 | Ledgerwood, III |
| 8,234,912 B2 | 8/2012 | Suarez-Rivera et al. |
| 8,285,532 B2 | 10/2012 | Zangl et al. |
| 8,350,851 B2 | 1/2013 | Flew et al. |
| 8,374,836 B2 | 2/2013 | Yogeswaren |
| 8,423,337 B2 | 4/2013 | Hsu et al. |
| 8,498,853 B2 * | 7/2013 | Crawford ............... G01V 99/00 703/10 |
| 8,527,248 B2 * | 9/2013 | Thambynayagam ... E21B 44/00 703/10 |
| 8,577,660 B2 | 11/2013 | Wendt et al. |
| 9,085,957 B2 * | 7/2015 | Wallace ................ E21B 43/00 |
| 2002/0112540 A1 | 8/2002 | Zeroug et al. |
| 2004/0237640 A1 | 12/2004 | Meister et al. |
| 2008/0319726 A1 | 12/2008 | Berge et al. |
| 2009/0006058 A1 | 1/2009 | King |
| 2009/0187391 A1 * | 7/2009 | Wendt ..................... G01V 1/28 703/7 |
| 2009/0020883 A1 | 10/2009 | Suarez-Rivera et al. |
| 2009/0260883 A1 * | 10/2009 | Suarez-Rivera ....... G01V 11/00 175/58 |
| 2011/0282635 A1 | 11/2011 | Liu et al. |

FOREIGN PATENT DOCUMENTS

| | | |
|---|---|---|
| WO | 2008/028075 | 3/2008 |
| WO | 2008/131351 | 10/2008 |
| WO | 2011/123774 | 10/2011 |

OTHER PUBLICATIONS

Andrä, Heiko, et al. "Digital rock physics benchmarks—Part I: Imaging and segmentation." Computers & Geosciences 50 (2013): 25-32.*

Salamon, M.D.G., (1968), "Elastic Moduli of a Stratified Rock Mass", *Int. J. Rock Mech. Min. Sci.*,. vol. 5, pp. 519-527.

Backus, G. E. (1962), "Long-Wave Elastic Anisotropy Produced by Horizontal Layering", *J. Geophys. Res.* 67, pp. 4427-4440.

Chang, C., et al., (2006), "Empirical Relations Between Rock Strength and Physical Properties in Sedimentary Rocks", *J. Pet. Sci. & Eng.* 51, pp. 223-237.

Gerrard, C. M., (1982), "Equivalent Elastic Moduli of a Rock Mass Consisting of Orthorhombic Layers", *Int. J. Rock Mech. Min. Sci.* 19, pp. 9-14.

Guo, P., et al. (2009), "Lower and Upper Limits of Layered-Soil Strength", *Can. Geotech. J.* 46, pp. 665-678.

Khaksar, A., et al., (2009), "Rock Strength from Core and Logs: Where we Stand and Ways to go", *SPE 121972*, presented at the SPE EUROPEC/EAGE Annual Conference & Exhibition, Amsterdam, Netherlands, Jun. 8-11, 2009.

Li, D., et al., (2001), "A New Efficient Averaging Technique for Scalup of Multimillion-Cell Geologic Models", *SPE Reservoir Evaluation and Engineering.* 4, pp. 297-307.

Muskat, M., (1937), "Flow of Homogeneous Fluids Through Porous Media", *McGraw-Hill Book Co.*, New York City.

Raaen, A.M., et al., (1996), "FORMEL—A step forward in strength logging", *SPE 36533*, presented at the SPE Annual Technical Conference and Exhibition, Denver, CO, Oct. 6-9, 1996.

Rankine, W. J. M., (1857), "On the Stability of Loose Earth", *Philosophical Transactions of the Royal Society of London* 147, pp. 9-27.

Suarez-Rivera, R., et al., (2002), "Continuous Scratch Testing on Core Allows Effective Calibration of Log-Derived Mechanical Properties for use in Sanding Prediction Evaluation", *In Proceedings of the SPE/ISRM Rock Mechanics Conference*, Irving, Oct. 20-23, 2002.

Talierico, A., et al., (1988), "A Failure Condition for Layered Rock", *Int. J. Rock. Mech. Min. Sci.& Geomech.* Abstr. 25, pp. 299-305.

* cited by examiner

METHOD AND SYSTEM FOR GENERATION OF UPSCALED MECHANICAL STRATIGRAPHY FROM PETROPHYSICAL MEASUREMENTS

CROSS-REFERENCE TO RELATED APPLICATION

This application claims the benefit of U.S. Provisional Patent Application 61/837,488 filed Jun. 20, 2013, entitled METHOD AND SYSTEM FOR GENERATION OF UP SCALED MECHANICAL STRATIGRAPHY FROM PETROPHYSICAL MEASUREMENTS, the entirety of which is incorporated by reference herein.

FIELD OF THE INVENTION

This invention relates generally to the field of prospecting and more particularly to data processing. Specifically, the invention is a method for modeling subsurface volumes from one or more petrophysical measurements.

BACKGROUND

In the oil and gas industry, modeling of the subsurface is typically utilized for visualization and to assist with analyzing the subsurface volume for potential locations for hydrocarbon resources and well planning for field development. Accordingly, various methods exist for estimating the geophysical properties of the subsurface volume (e.g., information in the model domain) by analyzing the measurements from measurement equipment (e.g., information in the data domain). The measurements include some information of the geophysical properties that may be utilized to generate the subsurface model, such as petrophysical measurements.

The interpretation of the subsurface volume may be complicated by the rock properties within the subsurface, which is a particular problem in geomechanical modeling. Geomechanical models are a numerical representation of the state of stress and the deformation in the subsurface, which may include one or more reservoirs. The models may include various properties (e.g. density, porosity), fracture networks along with information regarding the pore pressures, stress and other mechanical properties (e.g. Young's modulus, cohesion, etc.).

By examining a few meters of core, the heterogeneity that exists at all scales in the subsurface is apparent. Sedimentary rocks exhibit heterogeneity at a range of length scales as a result of the diverse natural processes that produce sediment and disperse it as it is being deposited, and the diagenetic processes operative during subsequent burial. These differences produce materials that are compositionally and texturally heterogeneous in sedimentary successions. This heterogeneity exists both in a temporal and spatial sense over many length scales and reflects that, within genetically-related successions, sedimentary rocks are deposited as individual events (beds <0.01 m to 1 m vertical scale) that are stacked into thicker successions with related properties. Inevitably this variability in texture, fabric and composition has a direct effect on the mechanical properties of the rock. Heterogeneity on the meter scale or smaller is not typically represented in large-scale finite element models due to the number of elements that are required to realistically reproduce geologic variability in three dimensions.

Further, the recent abundance of wireline-based predictors of mechanical strength combined with scratch test technology has been utilized to predict the strength properties on the decimeter to millimeter scales. See, e.g., Suarez-Rivera, R., J. Stenebraten and F. Dagrain. 2002. Continuous Scratch Testing on Core Allows Effective Calibration of Log-Derived Mechanical Properties for use in Sanding Prediction Evaluation. In Proceedings of the SPE/ISRM Rock Mechanics Conference, Irving, 20-23 Oct. 2002. However, field scale geomechanical models are not currently capable of incorporating this level of heterogeneity.

Accordingly, a fundamental problem in geomechanical modeling involves transforming measured complexity in the subsurface to a simplified numerical model, with minimal loss of information. This process, which is referred to as upscaling, is a technique for converting a detailed geologic model to a coarser-grid simulation such that the development of stress and deformation in the two systems are comparable. Examples of elastic and plastic mechanical properties being upscaled are described in the various references, wherein the effective mechanical properties of layered solids are addressed. For example, Salamon and Backus considered the elastic strain energy and effective seismic response of a layered medium respectively. Taliercio et al. and Guo et al. examine the effective strength of a layered Mohr-Coulomb material, with special emphasis on the importance of layer orientation relative to the maximum stress, and its influence on anisotropic strength. See, e.g., Salamon, M. D, G. 1968. Elastic Moduli of a Stratified Rock Mass, Int. J. Rock Mech. Min. Sci. 5:519-527; Backus, G. E. 1962. Long-Wave Elastic Anisotropy Produced by Horizontal Layering. J. Geophys. Res. 67:4427-4440; Talierico, A., and G. S. Landriani. 1988. A Failure Condition for Layered Rock. Int. J. Rock. Mech. Min. Sci.& Geomech. Abstr. 25:299-305; and Guo, P., and F. E. Stolle. 2009. Lower and Upper Limits of Layered-Soil Strength. Can. Geotech. J. 46:665-678.

Despite these techniques, the upscaling of mechanical properties for use in a geomechanical model can fail to capture certain subsurface aspects properly. For example, standard logging tools provide estimates of petrophysical rock properties at a resolution of decimeters, and numerous predictive algorithms have been described that subsequently provide the generation of elastic-plastic mechanical properties from such wireline-based petrophysical measurements. However, these log-generated mechanical properties can be highly variable over the length scale of a single element in a geomechanical model and while petrophysical measurements reflect the gradations and heterogeneity in mechanical properties, no method exists to properly upscale the observed variability in the earth to a simplified layered model in which the upscaled mechanical units are of a tractable size for numerical simulation, and the mechanical properties assigned to these units are representative of the bulk deformation behavior of the heterogeneous material contained within them. Conventional methods for upscaling elastic and plastic mechanical properties do not properly handle upscaling of actual data. Analytic methods have been discussed in the literature to upscale a layered heterogeneous system into a representative material, but the process of upscaling all the layers into just one layer results in a loss of information. The characteristics and distribution of the deformation are not accurately represented unless some of the heterogeneity is preserved.

As the recovery of natural resources, such as hydrocarbons rely, in part, on a subsurface model, a need exists to enhance subsurface models of one or more petrophysical properties. In particular, a method of upscaling observed geologic heterogeneity into a finite number of mechanical units that can be input into numerical models is apparent.

This method may utilize petrophysical data (e.g., log-data) as an input and automatically divide the subsurface into a finite number of discrete mechanical units based on the scale of the geomechanical problem being addressed. Also, a method for the upscaling of mechanical properties is needed to capture the deformation characteristics of the fully heterogeneous fine-scale model with a coarser resolution geomechanical model. That is, a need exists for a method that preserves some of the heterogeneity so that the resulting geomechanical models reasonably represent the subsurface without having to include model resolution on the order of feet.

SUMMARY

In one embodiment, a method for modeling strength properties in subsurface formations is described. The method comprises: obtaining strength properties that are associated with a subsurface region; determining a representative lateral length scale; filtering the strength properties to smooth the strength properties, wherein the degree of smoothing is based on the representative lateral length scale; determining mechanical layer boundaries, wherein a mechanical unit is bounded by two respective mechanical layer boundaries; determining bulk strength properties for each of the mechanical units formed between respective mechanical layer boundaries and thereby upscaling the strength properties within each of the mechanical units; and creating a subsurface model based on the determined bulk strength properties. Strength properties can refer to either the mechanical properties (e.g. friction angle and cohesion) used to calculate the failure strength of a material at a given confining pressure, or the failure strength value itself.

In yet another embodiment, a system associated with the drilling of a wellbore is described. The system comprises: a processor; memory coupled to the processor; an application stored in the memory and configured to: obtain strength properties that are associated with a subsurface region; determine a representative lateral length scale; filter the strength properties to smooth the strength properties, wherein the degree of smoothing is based on the representative lateral length scale; determine mechanical layer boundaries, wherein a mechanical unit is bounded by two respective mechanical layer boundaries; determine bulk strength properties for each of the mechanical units formed between respective mechanical layer boundaries and thereby upscaling the strength properties within each of the mechanical units; and create a subsurface model based on the determined bulk strength properties; and a monitor coupled to the processor and configured to present aspects of the subsurface model.

In yet another embodiment, a method for producing hydrocarbons is described. The method comprises: obtaining strength properties that are associated with a subsurface region; determining a representative lateral length scale; filtering the strength properties to smooth the strength properties, wherein the degree of smoothing is based on the representative lateral length scale; determining mechanical layer boundaries, wherein a mechanical unit is bounded by two respective mechanical layer boundaries; determining bulk strength properties for each of the mechanical units formed between respective mechanical layer boundaries and thereby upscaling the strength properties within each of the mechanical units; and creating a subsurface model based on the determined bulk strength properties; and producing hydrocarbons based on the subsurface model. The method may also include utilizing the subsurface model to develop a drilling plan and/or utilizing the subsurface model to develop a production plan.

In one or more of the embodiments, the method or system may include certain enhancements. For example, determining the representative lateral length scale may comprise determining a model domain or a length scale of a feature of interest; wherein filtering the strength properties may comprise calculating strength at each depth data point for a confining stress value and shifting the calculated strength data to have a zero mean. Further, calculating strength for a confining stress value may comprise calculating a failure strength from predictions of friction angle and cohesion for the confining stress as a function of depth; filtering the strength properties may comprise: converting the strength properties into the Fourier domain; and removing wavelengths below a threshold; determining mechanical layer boundaries may comprise identifying zero-crossings of the filtered strength properties; determining mechanical layer boundaries may comprise identifying crossings of the filtered strength properties with an arbitrary function; the method may include editing the mechanical layer boundaries to move a boundary to a nearby depth or to reduce the number of mechanical units in the subsurface model; editing the mechanical layer boundaries to reduce the number of mechanical units in the subsurface model comprises removing mechanical units based on mechanical units within the subsurface model that have strength contrasts relative to neighboring mechanical units below a threshold; wherein the threshold is determined by analysis of the amplitude of the filtered strength profile or the bulk mechanical properties between the mechanical layer boundaries; wherein determining bulk strength properties for each of the mechanical units defined by the mechanical layer boundaries comprises upscaling the strength properties to equivalent bulk strength properties, wherein the bulk strength properties are calculated by single values for strength parameters; wherein the strength parameters are friction angle and cohesion; and wherein the strength properties are generated from petrophysical data and/or from the analysis of well log data.

BRIEF DESCRIPTION OF THE DRAWINGS

The foregoing and other advantages of the present disclosure may become apparent upon reviewing the following detailed description and drawings of non-limiting examples of embodiments.

DETAILED DESCRIPTION

Figure 1:
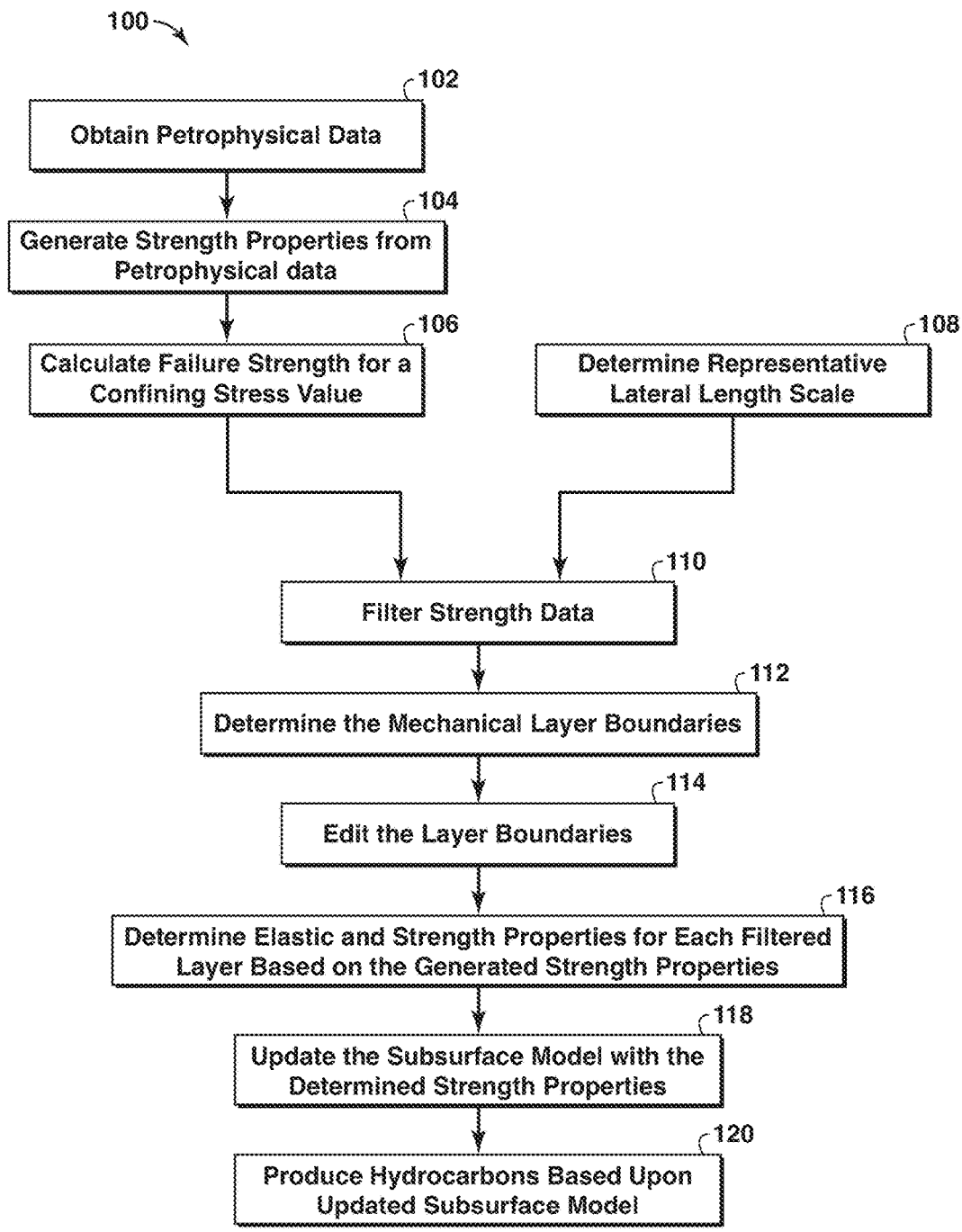
FIG. 1 is a flow diagram for generating mechanical stratigraphy from petrophysical data in accordance with an exemplary embodiment of the present techniques.

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent. Further, various terms and reference characters that are the same are utilized in the equations and associated description within the disclosure.

The present disclosure describes methods and systems to enhance subsurface models. The present techniques relate generally to the field of hydrocarbon production, and more particularly to geomechanical modeling. The present techniques utilize different techniques for numerically "averaging" measured heterogeneity into a representative value. The present techniques have identified specific length scales in the modeling that influence how deformation is distributed amongst, or localized within, mechanical units. Using this understanding, the present techniques intelligently generate units of mechanical stratigraphy, dependent on the model application, that are based on a distribution of mechanical properties with depth. Each unit in the mechanical stratigraphy may have both elastic and plastic mechanical properties, where the elastic properties may include Young's modulus, Poisson's ratio, bulk modulus, etc., and the plastic properties may include the parameters to define a yield surface that specify the peak strength (e.g. internal friction angle and cohesion) and the plastic potential surface (e.g. dilation angle) and the hardening rule. To validate the numerical methods used to "average" mechanical properties into an upscaled value, the technique is applied to strength data generated from laboratory testing of layered composite samples. Also, the stress and plastic strain development in large-scale geomechanical models that have been mechanically upscaled are compared to validate the techniques.

Because the log-generated mechanical properties can be highly variable over the length scale of a single element in a geomechanical model, the present techniques define layer boundaries for these mechanical units. While layer boundaries can be 'tuned" to conform to existing formation tops (e.g., boundary for a rock type), there is no a priori reasoning as to why mechanical stratigraphy should exactly conform to chronostratigraphic surfaces.

With the heterogeneity in the subsurface, the present techniques provide a finite number of mechanical units that can be input into numerical models. That is, the techniques automatically divide the subsurface into a finite number of discrete mechanical units based on the scale of the geomechanical problem being addressed. The scaling may range from mitigating wellbore failure to predicting surface compaction above a depleting reservoir, and the requirements for upscaling may be different depending on the specific application.

In one or more embodiments, the present techniques may include a workflow, which transforms petrophysical properties (e.g., derived from nuclear, electromagnetic or acoustic wireline measurements) into equivalent mechanical properties. First, the petrophysical measurements (e.g., log-measured quantities) may be obtained and used to generate strength properties. Different predictive relationships may be relied upon to provide empirical correlations between strength properties and petrophysical measurements. For example, Chang, C., M. D. Zoback and A Khaksar. 2006. Empirical Relations Between Rock Strength and Physical Properties in Sedimentary Rocks. J. Pet. Sci. & Eng. 51:223-237; Khaksar, A., P. G. Taylor, Z. Fang, T. Kayes, A. Salazar and K. Rahman. 2009. Rock Strength from Core and Logs: Where we Stand and Ways to go. SPE 121972, presented at the SPE EUROPEC/EAGE Annual Conference & Exhibition, Amsterdam, Netherlands, 8-11 Jun. 2009; Raaen, A. M., K. A. Hovem, H. Joranson & Fjaer, E. 1996. FORMEL—a step forward in strength logging. SPE 36533, presented at the SPE Annual Technical Conference and Exhibition, Denver, Colo., 6-9 Oct. 1996; and Crawford, B. R., P. J. Gaillot and B. Alramahi. 2010. Petrophysical Methodology for Predicting Compressive Strength in Siliciclastic "sandstone-to-shale" Rocks. In Proceedings of the 44th US Rock Mechanics Symposium, Salt Lake City, 27-30 Jun. 2010 are exemplary references of such correlations. Once the mechanical properties are known on the fine scale, methods may be utilized to divide the measured geologic heterogeneity into an equivalent mechanical stratigraphy. For example, relatively weak units may potentially be lumped together with nearby similarly weak units. To provide the contrast in strength sufficient to warrant generation of a distinct new mechanical unit, a method is used to intelligently determining an admissible mechanical stratigraphy based on the length scale appropriate to the application of interest. Then, the process of upscaling, assigns bulk mechanical properties to each distinct mechanical unit representative of the heterogeneity contained within each unit.

It may be useful to compare the scaleup of mechanical properties and the various conventional flow-based techniques for upscaling multimillion-cell geologic models for reservoir simulation applications. Flow-based averaging, which is used in upscaling, calculates the effective properties for a coarse simulation grid that preserve fine-grid fluid-flow dynamics (including pressure and flow-rate) such that flow behavior in the two systems is the same. See e.g., Li, D., B.

Beckner and A. Kumar, 2001. A New Efficient Averaging Technique for Scalup of Multimillion-Cell Geologic Models. SPE Reservoir Evaluation and Engineering. 4:297-307. Averaging methods range from simple analytical averages of fine-scale permeability distributions to full numerical simulation methods (such as pressure solver techniques). As an example of the former, it is well-known that the effective permeabilities for a layered, permeable medium with no crossflow are the arithmetic mean for flow parallel to the layering direction and the harmonic mean for flow perpendicular to the layering direction. See, e.g., Muskat, M. 1937. Flow of Homogeneous Fluids Through Porous Media. McGraw-Hill Book Co., New York City. Unfortunately such simple averaging techniques are only applicable under specific circumstances of perfectly layered or perfectly random heterogeneity distributions. Alternatively, another approach of calculating the effective permeability of a coarse gridblock containing many fine gridblocks is through direct simulation under no-flow or periodic boundary conditions. This latter approach constitutes a "brute-force" method because many individual simulations have to be performed, and, as a result, the method may be orders-of-magnitude-slower by comparison with the other evaluation of analytic expressions approaches. The present techniques do not upscale using the "brute-force" approach, but utilize simple averaging methods to calculate effective mechanical properties for a coarse-layered subsurface model that preserve the gross elastic-plastic response of the equivalent fine-scale variability.

As elastic and plastic mechanical properties have to be upscaled, the effective elastic moduli and strength of layered solids have been addressed in various references. For example, Salamon and Backus considered the elastic strain energy and effective seismic response of a layered earth respectively. Taliercio et al. and Guo et al. examine the effective strength of a layered Mohr-Coulomb material, with special emphasis on the importance of layer orientation relative to the maximum stress, and its influence on anisotropic strength. See, e.g., Salamon; Backus; Talierico et al.; and Guo et al.

Further, as noted above, the wireline-based predictors of mechanical strength combined with scratch test technology provides the prediction of strength properties on the decimeter to millimeter scale. However, field scale geomechanical models are not currently capable of incorporating this level of heterogeneity. A workflow for the upscaling of mechanical properties is provided with the present techniques to capture the deformation characteristics of the fully heterogeneous fine-scale model with a coarser resolution geomechanical model. While various methods have been developed for flow-based upscaling of permeability distributions in geologic models for reservoir simulation applications, these workflows do not address the problems involved in upscaling of mechanical properties.

Various assumptions may be used to average the strength in a layered material. These techniques include: (i) the strength is assumed to be that of the weakest material in the composite (e.g., the strength is controlled by the weakest link); (ii) the strength is assumed to be that of the strongest material; (iii) the strength is a value between the two end member values (the weakest material and the strongest material). The present techniques rely upon the distinction between the conditions under which the effective "bulk" strength of the composite is determined by that of weakest material versus an "average" of the constituent layers. By "average" here we do not mean that it is a strictly weighted arithmetic mean, but that it is a function of the strengths of each layer and their relative volumetric proportions. The assumption that the strength of a composite is that of the strongest component is not assumed for the present techniques.

The workflow, which is described further below, may be initialized with petrophysical logs and results in a representative mechanical stratigraphy. By assuming a layer cake geometry, it is determined that fine scale frictional cohesive strength (plastic) properties can be averaged into a representative bulk material following the approach of Rankine, which is discussed further below. This builds upon existing analytic solutions for the upscaling of elastic properties that are based on the condition that the strain energies of the layered system and the representative vertical transversely isotropic (VTI) material are equivalent.

Once the boundaries of the mechanical units are defined, the upscaled elastic and plastic properties can be determined from the relationships outlined, as noted further below. However, defining the relevant boundaries to discrete mechanical units is not necessarily straight-forward. While, of course, discretization of mechanical units can be guided by the stratigraphic column, substantial lithologic variability can lead to very weak and very strong units coexisting within a specific geologic formation. Based on the numerical modeling results, it is also beneficial to note that the amount of weak or strong layers relative to surrounding layers should be considered in the analysis. A thin weak unit may fail early, but if this is only a small portion of the volume considered, the bulk of the deformation does not occur until much larger stresses are reached. Various aspects of the present techniques are described further in FIGS. 1 to 15.

In one embodiment, the present techniques involve a method to automatically generate a representative mechanical stratigraphy derived from petrophysical measurements, such as wireline-based log data, as shown in FIG. 1. There are three stages to the method. The first stage is to convert from petrophysical measurements to a continuous prediction of mechanical strength with depth (e.g., blocks 102 to 106). The second stage is to determine mechanical layer boundaries based on a filtered version of the continuous strength data (e.g., blocks 108 to 114). The third stage is to assign effective elastic and plastic mechanical properties (e.g., strength) to each of the mechanical units and use these properties in a geomechanical model to aide in the production of hydrocarbons (e.g., blocks 116 to 120). Each of these stages is discussed in more detail below.

The first stage is shown in blocks 102 to 106 in the flow diagram for generating mechanical stratigraphy from petrophysical data in accordance with an exemplary embodiment of the present techniques. At block 102, the petrophysical data may be obtained. The obtaining of the petrophysical data may include downloading the data, transferring the data into memory of a computer, or accessing the data from memory of a computer. The petrophysical data may include nuclear measurements, electromagnetic measurements, acoustic wireline measurements, and any other suitable measurement data. Observations from drill cuttings can also be used to augment the petrophysical dataset or in place of the petrophysical measurements if none are utilized. Then, at block 104, strength properties are generated from the petrophysical data. The strength properties may be determined based on empirical correlations, or alternatively, can be defined on the millimeter scale from scratch testing of recovered core. The strength properties may include internal friction angle and cohesion values as well as a range of other mechanical strength properties discussed below. Each of these properties may be determined as a function of depth.

Once the strength properties are generated, the failure strength for a confining stress value is calculated, as shown in block 106. For example, in one embodiment, the failure strength from predictions of strength properties for a representative confining stress as a function of depth may be calculated and then the continuous failure strength profile may be shifted to have a zero mean. In another embodiment, the failure strength at zero confining stress (unconfined compressive strength) could be used, the shifting to a zero mean may be performed to further identify which materials are stronger or weaker than average, but it is an optional step as an arbitrary function can also be prescribed to distinguish between strong materials (e.g., strength greater than the prescribed function) and weak materials (e.g., strength less than the prescribed function).

Once the failure strength is determined, it may be utilized to provide additional information about the subsurface, as shown in blocks 108 to 114. At block 108, the representative lateral length scale is determined. The representative lateral length scale may be associated with the particular geomechanical modeling application. (e.g., the lateral length scale when examining wellbore failure is much smaller than the lateral length scale used to examine surface subsidence due to field depletion). That is, the representative lateral length scale may be determined based on a determined model domain (e.g., model domain scale) or it may be based on the length scale of the features of investigation (e.g. well spacing if interactions between a producer and injector pair are being examined). The filtering of the strength data is shown in block 110. The filtering may utilize the length scale, such that the length scale is used to determine how to filter the strength data (longer length scales may be filtered to have a larger degree of smoothing than for shorter length scales). The filtering may include using Fourier methods to preserve the long wavelength features of the signal, but many methods can be applied, which are discussed further below.

Then, at block 112, the mechanical layer boundaries are determined. The mechanical layer boundaries may be determined based on the analysis of the output of block 110, which is the filtered strength data. If the original strength data had been shifted to have a zero mean, the zero-crossings of the filtered strength data may be utilized to determine the mechanical boundary layers. Alternatively, the crossings of the smoothed strength data and an arbitrary function can be used to determine layer boundaries.

Once the mechanical layer boundaries are determined, these boundaries may be further processed before determining equivalent bulk strength and elastic properties. At block 114, the mechanical layer boundaries are edited. The editing of the mechanical layer boundaries may include filtering and possibly modifying. This may include adjusting the layer boundaries by shifting identified layer boundaries (e.g., to a nearby depth point) to conform with identified geologic units (i.e. lithofacies identified from core or petrophysical data). The filtering of the layers (which may also be referred to as mechanical units) may include removing layers, which may be based on determining which layers are unnecessary (e.g., the layers with negligible strength contrasts relative to neighboring layers).

In the third stage, blocks 116 to 120, both elastic and plastic mechanical properties are upscaled into a representative mechanical model and this model is used to aide in the production of hydrocarbons. At block 116, the strength properties for each filtered layer are determined based on the generated continuous strength properties. That is, within the mechanical layer boundaries, upscale the variable strength properties (e.g., generated in block 104) to equivalent bulk strength properties. In the certain embodiments, the bulk strength properties are defined by a single value for each strength parameter, such as friction angle and cohesion or the like. The determination of bulk strength properties for each of the mechanical units (e.g., a mechanical unit is bounded by two respective mechanical layer boundaries) may include upscaling the strength properties within each of the mechanical units Then, at block 118, the determined strength properties may be utilized to update the subsurface model or generate a geomechanical subsurface model. The geomechanical model can then be used to assess the evolution of stress and deformation in the subsurface. This understanding can increase the ability to cost effectively produce hydrocarbons. This can be done, for example, by helping with well path design, completions design, platform design or determining depletion and drawdown production schedules to prevent well failure. Once the subsurface model or volume is updated, hydrocarbons may be produced by utilizing the subsurface model, as shown in block 120. As an example, the strength properties in the subsurface model may be utilized to enhance or influence hydrocarbon extraction from the subsurface region represented by the subsurface model. Various operations may then be conducted to remove hydrocarbons from the subsurface region, which may be accomplished by drilling a well using oil drilling equipment. The equipment and techniques used to drill a well and/or extract the hydrocarbons are well known by those skilled in the relevant art. Other hydrocarbon extraction activities and, more generally, other hydrocarbon management activities, may be performed according to known principles.

Conventional methods for upscaling elastic and plastic mechanical properties do not properly handle upscaling of actual data. Analytic methods have been discussed in the literature to upscale a layered heterogeneous system into a representative material, but the process of upscaling the layers into one layer results in a loss of information. The characteristics and distribution of the deformation are not accurately represented unless some of the heterogeneity is preserved. The present techniques preserve some of the heterogeneity so that the resulting geomechanical models reasonably represent the subsurface without having to include model resolution on the order of feet.

The calculation of failure strength based on a continuous measure of mechanical properties with depth can be determined via different techniques. In certain embodiments, a predictor of internal friction angle and cohesion based on log-derived porosity and clay content may be used. An example of one approach is described in Crawford. However, as noted above, there is a variety of strength properties that may be generated from the petrophysical data based on empirical correlations. The predicted strength properties may include the unconfined compressive strength, or the tensile strength or may be dependent on the specific material model employed. For example, if a Coulomb failure criterion is used the strength properties may include internal friction angle, $\varphi$, and cohesion values, $S_0$. If a Drucker-Prager yield criterion is used the strength parameters may include two material constants analogous to the Coulomb internal friction angle (to characterize the pressure dependence of strength) and cohesion (to characterize the strength at zero mean stress). For a critical state material model, the strength may be characterized by the slope of the critical state line, the intersection of the yield surface with the hydrostatic stress axis and shape parameters to describe the curvature of the dilative and compactive portions of the yield surface. This list is not exhaustive but illustrative of the types of parameters that can be used.

Then, the strength parameters may be converted into an equivalent failure strength, $\sigma_1$, as a function of depth assuming representative confining stresses $\sigma_2$ and $\sigma_3$. The method of determining the failure strength for the confining stress is dependent upon the material model employed and the correlative strength properties determined as a function of depth. Either one or two confining stress values could be used depending on the yield criterion and if it relies upon both the minimum, $\sigma_3$, and the intermediate principal stress, $\sigma_2$, values to determine the maximum principal stress (i.e. Drucker-Prager) or if it relies solely upon the minimum principal stress value (i.e. Coulomb). Also, it may be specified that the minimum and the intermediate principal stresses (the confining stresses) are the same value. In one embodiment, a Coulomb failure criterion is used and the failure strength is determined by the relation (e1):

$$\sigma_1 = \frac{1+\sin\varphi}{1-\sin\varphi}\sigma_3 + 2S_0\frac{\cos\varphi}{1-\sin\varphi} \quad (e1)$$

Figure 2:
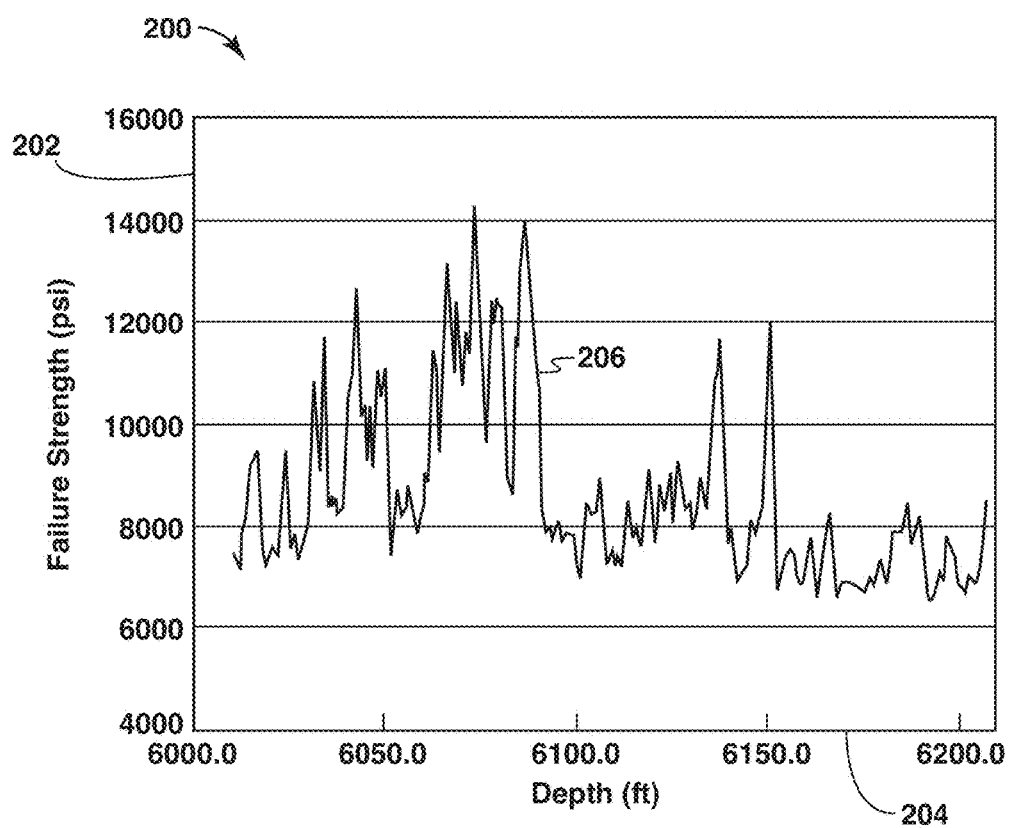
FIG. 2 is an exemplary graph of strength data along depth in accordance with an exemplary embodiment of the present techniques

FIG. 2 is an exemplary graph 200 of failure strength data along depth in accordance with an exemplary embodiment of the present techniques. The strength data of the subsurface volume is shown along the failure strength axis 202 in units of psi and depth is shown along axis 204 in units of feet (ft). The strength as a function of depth is shown by the solid line 206.

In certain embodiments, the failure strength profile from predictions of strength properties for a representative confining stress as a function of depth may be calculated and then the continuous failure strength profile may be shifted to have a zero mean. The shifting to a zero mean is done so that it is readily apparent which sections are stronger or weaker than average, but it is not a necessary step as an arbitrary function can also be prescribed to distinguish between strong (strength greater than the prescribed function) and weak (strength less than the prescribed function) sections.

The failure strength profile versus depth exhibits variation in strength over many length scales and a user determined blocking of the strength profile may be visual and highly user-dependent. It is readily apparent that this subjective approach is non-unique such that the number of layers and the specific layer boundaries may be different for each user.

To remove the user dependency, an approach may be an implementation of signal processing techniques in which shorter wavelength features of the data are removed to emphasize large-scale features. That is, the process may be automated to discretize mechanical stratigraphy through filtering. In certain embodiments, the strength data may be filtered using a Fast Fourier Transform (FFT) to remove wavelengths less than a threshold value, and the threshold value may be dependent on the lateral length scale identified in block 108. After performing an FFT, the variations in strength are represented in the frequency domain with a coefficient for each frequency of oscillation in the original signal. The longer wavelength signals are preserved because they represent meaningful variations, but it is not necessary to preserve each peak or trough in the original data. Therefore, a cutoff wavelength $\lambda_{cut}$ is defined below which the coefficient is set to zero, and above which the coefficient is preserved. The choice of cutoff wavelength $\lambda_{cut}$ may be user dependent and is discussed in greater detail below. The method described herein may be implemented as a boxcar filter, but other filter shapes may be implemented, as well.

While the filtering of the wavelengths may include using Fourier methods, other methods of filtering to smooth the data may include moving average or moving median methods where the size of the moving window is dependent on the representative lateral length scale. Furthermore, weighted moving averages and exponential moving averages may also be used.

As a first step in the FFT procedure, the failure strength data may be shifted to a zero mean. Then the data is smoothed by removing the high frequency components. This aspect is shown in greater detail in FIGS. 3A to 3D. FIGS. 3A to 3D are exemplary graphs 300, 320, 340 and 360 of strength data along depth for different cutoff wavelengths for exemplary in accordance with an exemplary embodiment of the present techniques. In these FIGS. 3A to 3D, the filtering of strength data is performed using four different cut-off values for a minimum frequency. The strength data has been shifted to a mean of zero and mechanical units are defined by zero-crossings of the smoothed data and darker banding reflects the final unit selection. Small white dots (312 and 314) denote zero-crossings that were ignored, which is part of block 114. The wavelength $\lambda$ is the length scale of interest identified in block 108.

In FIGS. 3A to 3D, the strength data of the subsurface volume is shown along the failure strength axis 302, 322, 342 and 362 in units of pounds per square inch (psi) and depth is shown along axis 304, 324, 344 and 364 in units of feet (ft). The graphs 300, 320, 340 and 360 show the data filtered with four different values for cutoff wavelength $\lambda_{cut}$ (where $\lambda_{cut}$ increase as $\lambda$ increases from 50 ft, 100 ft, 500 ft and 1000 ft for the respective graphs 300, 320, 340 and 360). The equivalent failure strength $\sigma_1$, as a function of depth, for a representative confining stress $\sigma_3$, is shown by the dashed lines, such as dashed lines 308, 328, 348 and 368. These lines have been shifted to have a zero mean to highlight the areas that are stronger and weaker than average and provide guidance in the selection of mechanical layer boundaries. The different smoothed strength profiles are show by the solid lines, such as lines 306, 326, 346 and 366.

The zero crossings of these filtered lines 306, 326, 346 and 366 are where these lines intersect with lines 310, 330, 350 and 370 respectively. Using the zero crossings provides a mechanism to automatically generate the mechanical stratigraphy from the continuous strength profile and may also minimize the issue of user dependent discretization. Further, the light banding regions and dark-banding regions in the background of the graphs 300, 320, 340 and 360 shows the discrete mechanical units associated with the zero crossings. For example, the graph 300 has the continuous strength profile discretized into nine mechanical units, while the graph 360 has the continuous strength profile discretized into two mechanical units.

Further, the method of removing high frequency variations in strength profiles with depth results in preservation and emphasis of gross, larger-scale mechanical variability. Shifting the strength data to a zero mean and identifying zero crossings divides the subsurface into discrete mechanical units. The amount of high frequency data removed is dependent on the particular geomechanical model application and determines the number of mechanical units.

Figure 3A:
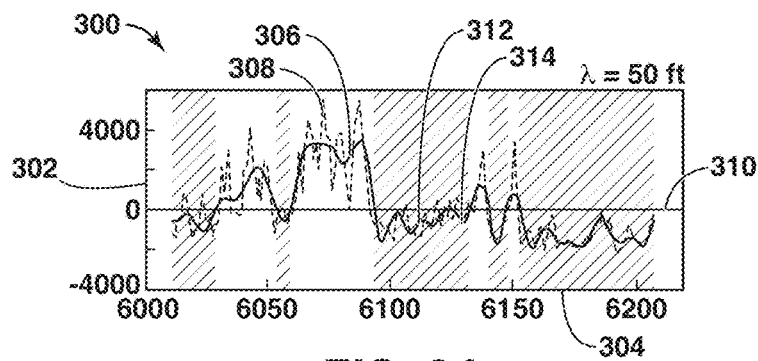
FIGS. 3A to 3D are exemplary graphs of strength data along depth for different cutoff wavelengths in accordance with an exemplary embodiment of the present techniques.
Figure 3B:
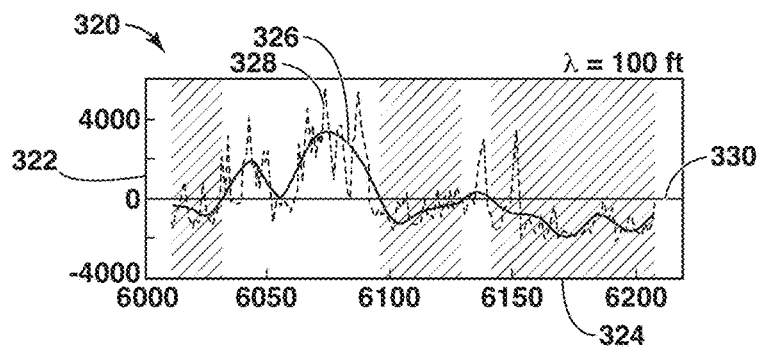
Figure 3C:
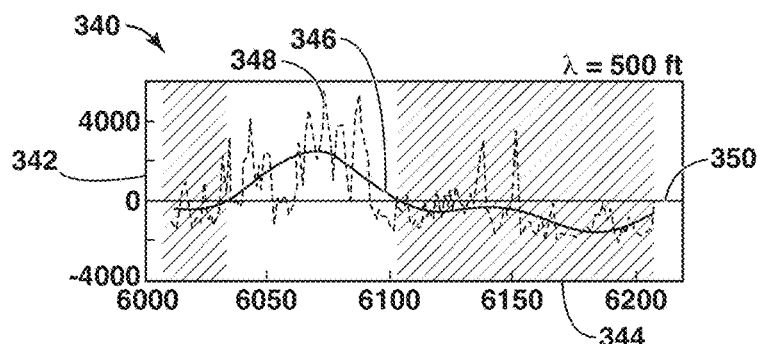
Figure 3D:
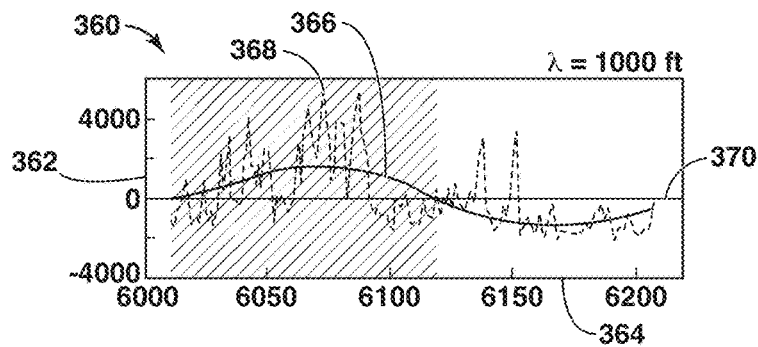

As another enhancement, an automated procedure that discards or removes certain zero crossings may be utilized, which is shown in block 114 of FIG. 1. For example, a zero-crossing that is located close to an edge of the region of interest, results in a very thin layer (e.g., mechanical unit)

with minimal effect on the model results. Therefore, an identified layer boundary a few data points from the edge of the region of interest may be disregarded. Additionally, a layer that contains a smoothed profile of low amplitude (e.g., above or below the mean zero-crossing line) may be another discarded layer. The objective of shifting the data and using the zero-crossings is to separate the data into two bins: (i) strong layers and (ii) weak layers. However, if the amplitude of the filtered profile is small compared to other identified layers, it is not substantially stronger or weaker than the neighboring layers and need not become a separate layer. Accordingly, a threshold may be utilized to specify that if the amplitude of the filtered line within a layer (e.g., defined by the zero crossings) is less than 10% of the maximum amplitude within any layer, then it is not included as a separate layer. For example, the points, such as points 312 and 314 of FIG. 3A, are zero-crossings that are ignored based on this threshold determination. In another embodiment, editing the layer boundaries, which is shown in block 114 of FIG. 1, may comprise moving identified layer boundaries to the zero-crossings of the un-smoothed strength data.

In certain embodiments, the FFT procedure removes the variability of selecting the layer boundaries, but a cutoff wavelength $\lambda_{cut}$ has to be specified. In other embodiments with various other filters used to smooth the data, parameters are specified such as the size of the floating window over which to take an average. To determine a relevant value for cutoff wavelength $\lambda_{cut}$, the length scale of the problem or the horizontal aspect ratio should be considered, as discussed further in relation to the models in FIG. 4.

Figure 4:
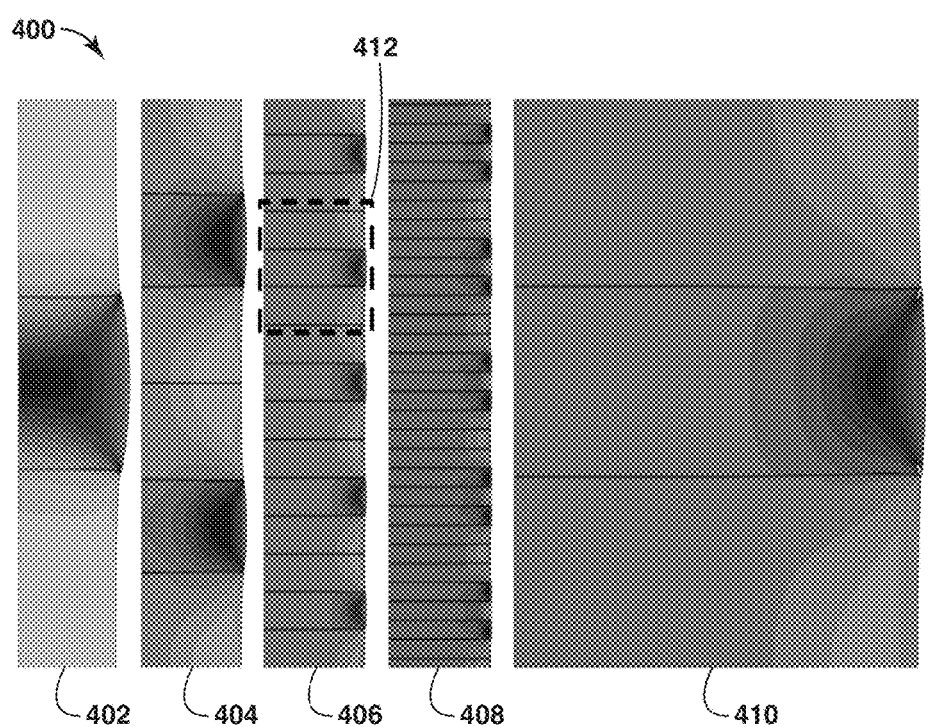
FIG. 4 is a set of exemplary graphs of distribution of plastic deformation in axisymmetric models of layered specimens with varying numbers of layers and aspect ratios in accordance with an exemplary embodiment of the present techniques.

FIG. 4 is a set 400 of distribution of plastic deformation (e.g., dark regions or colors indicate more plastic deformation, while lighter regions or colors indicate less plastic deformation) in axisymmetric models 402, 404, 406, 408 and 410 of layered specimens with varying numbers of layers and aspect ratios in accordance with an exemplary embodiment of the present techniques. Due to the model symmetry, only one half of each model is shown and the left hand side of each of the models 402, 404, 406, 408 and 410 is a plane of symmetry and the length scale of interest is the width of the half model shown. Each of the models 402, 404, 406, 408 and 410 are made of layers of two different materials with their respective mechanical properties and the same two constituent materials are used in each of the models. Each model has twice the number of weak layers as strong layers and the layers with concentrations of plastic deformation (e.g., dark regions) are the weak layers. These models 402, 404, 406, 408 and 410 indicate that the distribution of plastic deformation is dependent on the ratio of the layer thickness to the horizontal length scale of the model domain (e.g., designated by the horizontal aspect ratio (HAR)). The HAR (the ratio of the layer thickness to the horizontal length scale) decreases from 1.33 in model 402 to 0.67 in model 404 to 0.27 in model 406 to 0.13 in model 408 and the HAR is 0.27 in model 410. In model 402, with a high HAR, the deformation is localized in the one weak layer so it is clear that the strong and weak layers cannot be lumped together into one layer without losing the ability to capture the characteristics of the deformation. The models 406 and 408 have a smaller HAR of 0.27 and 0.13 and the weak and strong layers are both deforming and can be averaged together without losing the ability to capture fine-scale deformation. Therefore, for larger HAR models (e.g., wellbore scale), it may be useful to have more layers, while for smaller HAR models (e.g., well-spacing scale) fewer layers are necessary. Therefore, to determine the cutoff wavelength, $\lambda_{cut}$, the horizontal length scale of interest, $\lambda$, has to be defined and then the cutoff wavelength $\lambda_{cut}=f(\lambda)$ with cutoff wavelength $\lambda_{cut} \leq \lambda$ may be defined.

Figure 5:
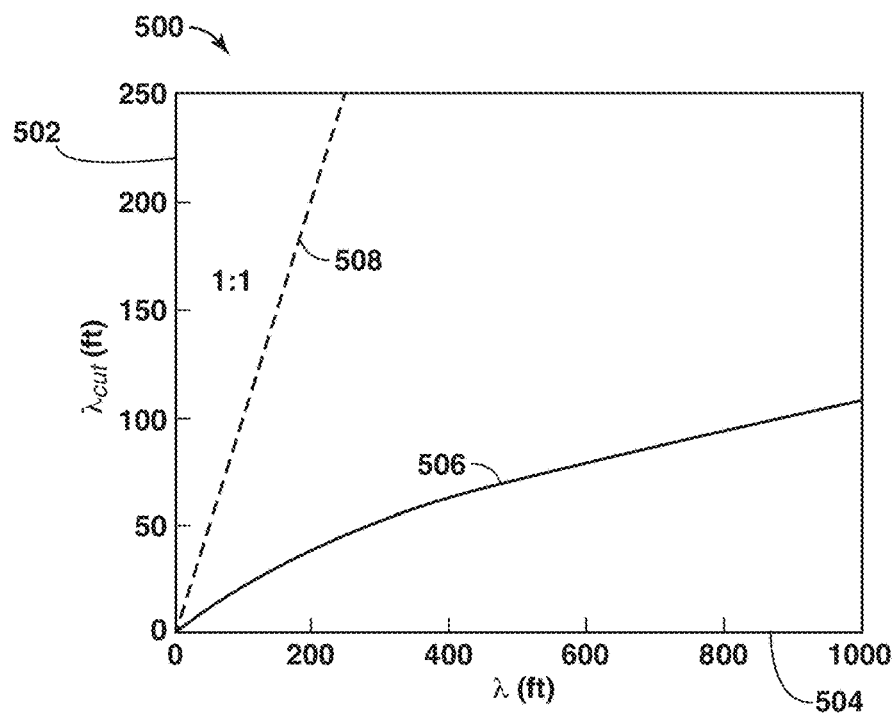
FIG. 5 is an exemplary graph of a relationship between the lengthscale of interest and the cutoff wavelength in accordance with an exemplary embodiment of the present techniques.

As an example, the relationship between the lengthscale of interest, $\lambda$, and the cutoff wavelength, $\lambda_{cut}$, is shown in FIG. 5. FIG. 5 is an exemplary graph 500 of a relationship between the lengthscale of interest and the cutoff wavelength in accordance with an exemplary embodiment of the present techniques. The function $f(\lambda)$ should be a line that is monotonically increasing. In this example, the cutoff wavelength, $\lambda_{cut}$ is defined by the equation (e2):

$$\lambda_{cut} = b\lambda + (1 - e^{-a\lambda})\left(\frac{0.25 - b}{a}\right) \quad (e2)$$

Where a=0.004 and b=0.06

In graph 500, the response 506 is shown along the cutoff wavelength $\lambda_{cut}$ axis 502 in units of feet (ft) and along the lengthscale of interest, $\lambda$, axis 504 in units of feet (ft). The line 508 is the one-to-one line to illustrate that $\lambda_{cut}$ is less than $\lambda$.

Once the boundaries of the mechanical units are defined, the upscaled elastic and plastic properties can be determined from the relationships, which are discussed further below. For example, an analytical approach for assigning effective mechanical properties to a composite, layered material is described for upscaling of elastic properties for a layered composite and then for upscaling of plastic (e.g., strength) properties for a layered composite.

With respect to upscaling the elastic properties of a layered composite, a stratified rock with horizontal layers is a vertical transversely isotropic (VTI) medium. That is, the response is the same in the two horizontal directions (parallel to the layering) but different in the vertical direction (perpendicular to the layering). Previous work by Salamon, which is cited above, developed analytical expressions for the five elastic moduli that describe the VTI medium based on the properties of each of the layers. In this derivation, each of the layers was assumed to be transversely isotropic, but Gerrard extended that method to include orthorhombic symmetry. See e.g., Gerrard, C. M. 1982. Equivalent Elastic Moduli of a Rock Mass Consisting of Orthorhombic Layers. Int. J. Rock Mech. Min. Sci. 19:9-14. Both analyses derived these relations from the condition that the strain energies of the layered system and the representative VTI material be equivalent. The methods also made the assumption that the scale of the system is large compared to the layer thickness, which is a useful assumption in the application of strength upscaling. That is, the current embodiment assumes (but is not limited to) that the material in each fine-scale layer is isotropic and the equations of Salamon, which is cited above, are utilized to upscale variability in measured elastic moduli into a representative coarse-scale mechanical unit.

In addition to the upscaling of elastic properties for a layered composite, the plastic (i.e. strength) properties for a layered composite may also be upscaled. For example, to analytically upscale the strength of a layered material, the Rankine's approach of lateral earth pressures as applied to retaining walls may be utilized. See, e.g., Rankine, W. J. M. (1857) On the Stability of Loose Earth. Philosophical Transactions of the Royal Society of London. 147:9-27. In this approach, which was used to evaluate the forces that layered soil would exert on a retaining wall, if the vertical stress is known, then the horizontal stresses can be determined. These lateral forces act at depth, or in the laboratory the lateral forces are in response to the confining pressure or imposed vertical shortening. If the subsurface sample or a lab sample is composed of mechanically different layers, each layer has a different horizontal stress, $\sigma_3$, in response to a vertically directed loading, $\sigma_1$. The sum of these forces along a boundary can be used to determine a representative stress applied at the boundary of the sample. Therefore, while there can be variations in the horizontal stress with depth, it is assumed that there is a bulk stress state that can represent the state of the heterogeneous sample, which is shown in FIG. 6.

Figure 6:
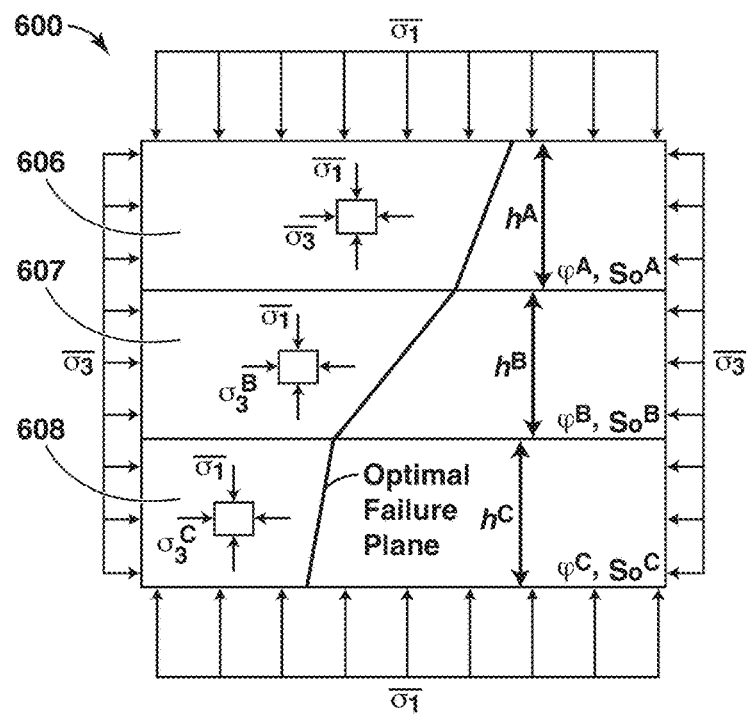
FIG. 6 is a diagram of a relationship between horizontal and vertical stresses in each layer of a composite media.

FIG. 6 is a diagram 600 of the relationship between horizontal and vertical stresses in each layer 606, 607 and 608 of a composite media. The stresses can be determined from the strength parameters for each of the layers 606, 607 and 608. The horizontal stresses in each of the layers 606, 607 and 608 can then be used to determine the representative horizontal stress of the composite. The stress of the sample is represented by a vertical stress, $\overline{\sigma_1}$, and horizontal stress components, $\overline{\sigma_2}$ and $\overline{\sigma_3}$. For this example, the horizontal stresses are assumed to be equal and therefore $\overline{\sigma_2}=\overline{\sigma_3}$.

To determine the representative stress state, the relationship between horizontal and vertical stresses has to be specified and this can be done through the use of the selected yield function. For Coulomb failure, the relationship between the two principal stresses is stated as a function of the friction angle, $\varphi$, and a cohesion, $S_0$ (e.g., $\varphi^A$ and $S_0^A$ for layer 606; $\varphi^B$ and $S_0^B$ for layer 607, and $\varphi^C$ and $S_0^C$ for layer 608). Based on the diagram 600, the vertical stress in each of the layers 606, 607 and 608, $\sigma_1^n$, (n=A, B, C), respectively, is the same such that the vertical stress that represents the stress state of the sample, $\overline{\sigma_1}=\sigma_1^A=\sigma_1^B=\sigma_1^C$. If the strength properties of each layer are known (e.g., the respective $\varphi$ and $S_0$), then the horizontal stress in the layer can be determined from the yield function in equation (e3)

$$\sigma_3^n = \frac{1 - \sin \varphi^n}{1 + \sin \varphi^n} \sigma_1^n - 2 S_0^n \frac{\cos \varphi^n}{1 + \sin \varphi^n} \qquad (e3)$$

However, this assumes that each of the layers is failing. This implies that the deformation is not controlled by the weakest layer, but is a function of the strength properties of the layers. If a layer is not failing, the equation (e3) may not be used to determine the horizontal stress and the method cannot be applied. The validity of the assumption that each of the layers are failing relates to the discussion of the HAR; when the HAR is small, deformation is distributed amongst the layers and the assumption is valid.

Given the horizontal stress in each layer, and the thickness of each layer, $h^n$ (e.g., $h^A$, $h^B$ and $h^C$ for the respective layers 606, 607 and 608), the representative horizontal stress can be found by a simple force balance of equation (e4):

$$\overline{\sigma_3} = \frac{h^A \sigma_3^A + h^B \sigma_3^B + h^C \sigma_3^C}{h^A + h^B + h^C} \qquad (e4)$$

The general form of equation (e4) can have any number of layers (A, B, C, D, . . . ) and has the same form as equation (e4).

With equations (e3) and (e4), the representative stress state at failure is known in terms of individual layer thicknesses, $h^n$, friction angles, $\varphi^n$, and cohesions, $S_0^n$, for a respective layer n. From a knowledge of the effective stress state at failure, the representative (i.e. effective or bulk) friction angle, $\overline{\varphi}$, and cohesion, $\overline{S_0}$, can be determined by the relations in equation (e5):

$$\overline{S_0} = \frac{1 + \sin \overline{\varphi}}{\cos \overline{\varphi}} \sum_n h^n \frac{\cos \varphi^n}{1 + \sin \varphi^n} S_0^n \qquad (e5)$$

where $\overline{\varphi}$ can be determined from the implicit equation (e6):

$$\frac{1 - \sin \overline{\varphi}}{1 + \sin \overline{\varphi}} = \sum_n h^n \frac{1 - \sin \varphi^n}{1 + \sin \varphi^n} \qquad (e6)$$

Similar relationships can be determined if a Drucker-Prager failure criterion is used rather than a Coulomb failure criterion.

A simplifying assumption about the strength parameters of a layered system is that the friction angle and cohesion are simple arithmetic averages of the component layers with weighting coefficients equal to the normalized layer thickness. While there is no physics-based justification for this assumption, a comparison of the bulk properties derived and those of a simple arithmetic average show that the arithmetic average is a reasonable approximation. The error of the arithmetic average is generally less than 5% for the friction angle and 10% for the cohesion. The derivation provides a physical basis for the use of the arithmetic average as a reasonable approximation to the bulk strength parameters.

Figure 7:
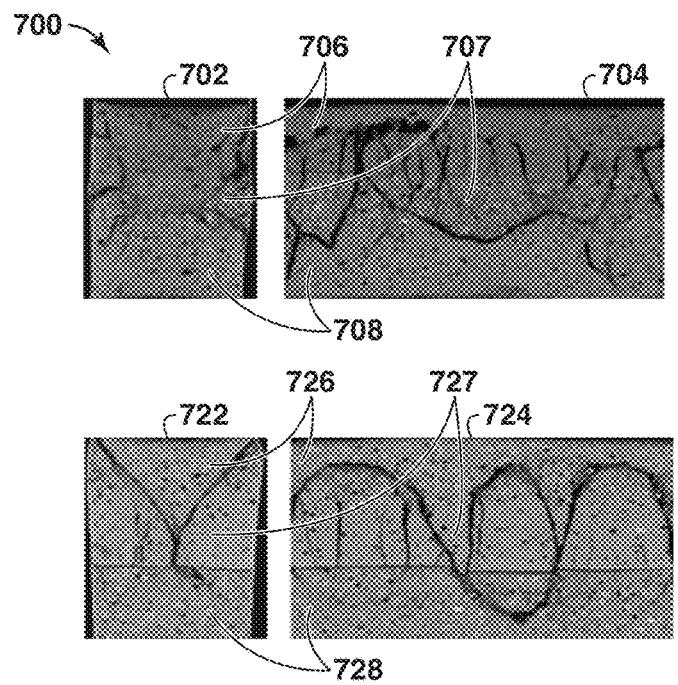
FIG. 7 is a set of computed tomography diagrams of layered concrete samples after triaxial compression testing.
Figure 9:
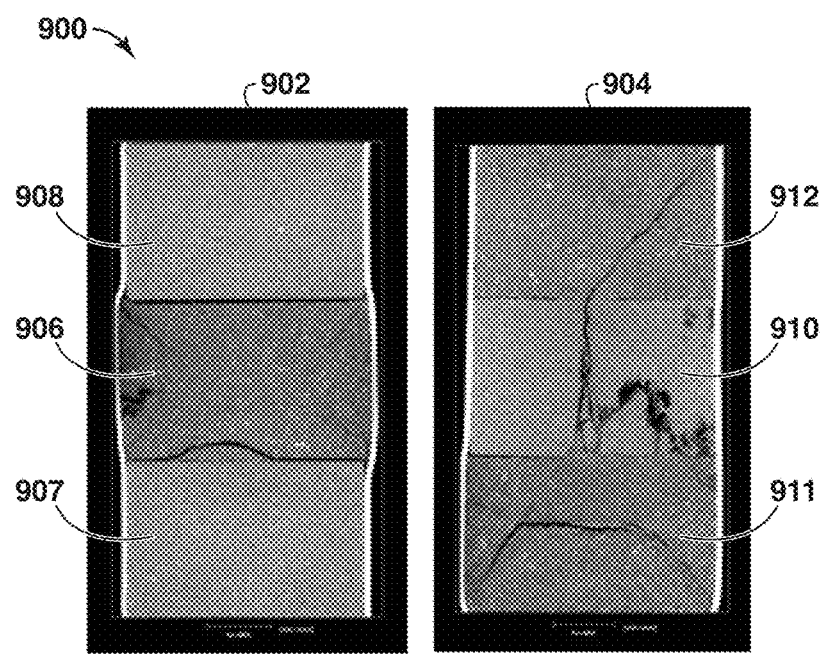
FIG. 9 are a set of computed tomography diagrams of layered sandstone samples after triaxial compression testing.

To verify the concept of upscaling the strength of individual layers into bulk strength parameters, triaxial compression testing on artificially layered composite specimens has been performed. Four end member constituents were used, two of which were concrete samples, which are shown in FIG. 7, and two of which were sandstone samples, which are shown in FIG. 9. A series of triaxial tests were performed on samples of each of the end-members to characterize their mechanical properties.

The two concretes used for testing are exemplary concretes commonly available. The concrete specimens were composed of three layers that were poured into 4"-diameter plastic molds in three phases. Each layer was approximately 2.7 inches tall so that a 4 inch×8 inch specimen resulted. These samples underwent triaxial compression testing at 500 psi confining stress. This test was performed by surrounding the specimen with fluid at a pressure of 500 psi and then imposing a displacement at the top of the specimen to force a shortening of the specimen. The shortening of the specimen was perpendicular to the layers and the confining pressure was applied parallel to the layers. The results of this testing are shown in FIGS. 7 and 8.

FIG. 7 are a set 700 of computed tomography (CT) diagrams 702, 704, 722 and 724 of layered concrete samples after triaxial compression testing. The first concrete sample is used to provide a vertical cross-sectional diagram 702, which is cross-sectional view, and a cylindrical diagram 704, which is an unwrapped view. Similarly, the second concrete sample is used to provide a vertical diagram 722, which is cross-sectional view, and a cylindrical diagram 724 which is an unwrapped view. In diagrams 702 and 704, the first concrete sample has three layers 706, 707 and 708, where the middle layer 707 is the weak end-member. In diagrams 722 and 724, the second concrete sample has three layers 726, 727 and 728, where the middle layer 727 is the strong end-member.

Deformation is present throughout each of the layers of both samples (e.g., layers 706, 707 and 708 for the first concrete sample, and layers 726, 727 and 728 for the second concrete sample). The resulting stress-strain responses from the experiments show that the strengths of the composite specimens reflect the volumetric proportions of the end-members. The first concrete sample with two strong layers 706 and 708 and one weak layer 707 was stronger than the second concrete sample composed of two weak layers 726 and 728 and one strong layer 727. The strength of the layered composite samples lies between that of the two end-member components.

Figure 8:
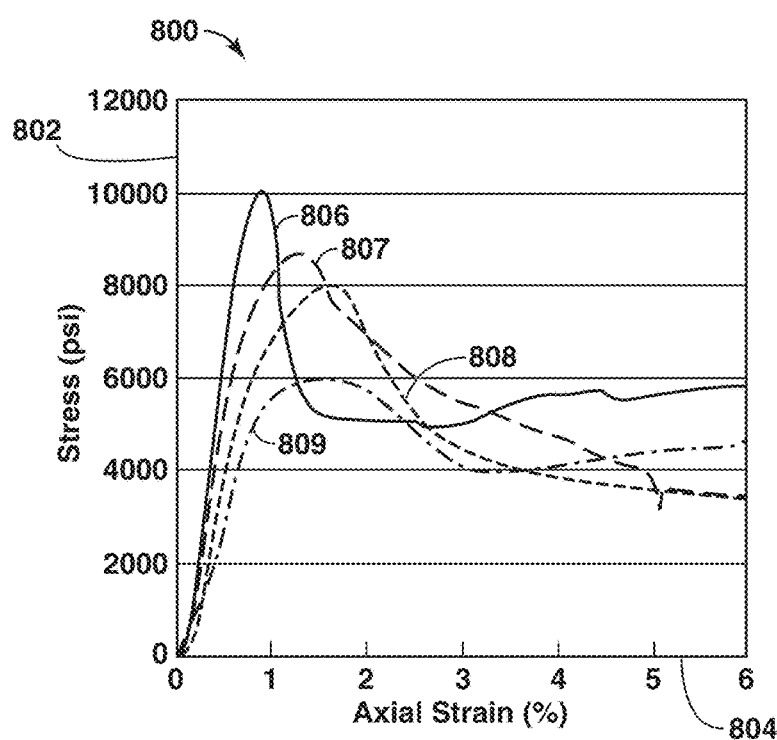
FIG. 8 is an exemplary graph of stress-strain responses for the concrete samples, which include the concrete samples of FIG. 7.

As an example of these results, FIG. 8 is an exemplary graph 800 of stress-strain response for the concrete samples, which include the samples in FIG. 7. In the graph 800, the responses 806, 807, 808 and 809 are shown along the stress axis 802 in psi and the axial strain percentage (%) axis 804. The response 806 is the relationship for the strong sample, while the response 809 is the relationship for the weak sample. The response 807 is the relationship for the composite that is ⅔ strong material and ⅓ weak material (e.g., the first concrete sample of FIG. 7), while the response 808 is the relationship for the ⅔ weak and ⅓ strong material (e.g., the second concrete sample of FIG. 7). The composite strength reflects the volumetric proportions of the two end-members. These results validate the strength upscaling approach described above.

The two sandstone samples used for testing are Williams Fork (WF) and New Gray Tan (NGT) outcrop sandstones. NGT was found to have a significantly greater friction angle and cohesion than the WF sample and therefore constitutes the strong end-member at all pressures. The sandstone specimens were composed of three 1.5 inch diameter×1 inch tall discs stacked together, which are discussed further in FIG. 9. These samples underwent triaxial compression testing at 500 pounds per square inch (psi) confining stress using the same procedure as was applied to the concrete specimens.

FIG. 9 are a set 900 of computed tomography (CT) diagrams 902 and 904 of layered sandstone samples after triaxial compression testing. Diagram 902 is a sample composed of one weak layer 906 of WF between two strong layers 907 and 908 of NGT. Diagram 904 is a sample composed of one strong layer 910 of NGT between two layers 911 and 912 of weak WF. The CT scanning of the deformed sandstone samples does not indicate that both the weak and strong layers (e.g. end members) failed. In diagram 902, deformation is confined to the weak layer 906, while the two strong layers 907 and 908 are un-deformed. However, in diagram 904, each of the layers 910, 911 and 912 are deformed and the strong layer 910 appears to have failed in tension rather than in shear, which is how the weak layers 906, 911 and 912 failed. In the embodiment, that employs friction angle and cohesion as the strength parameters, only the failure in shear is considered, so for the purposes here, the strong layer that fails in tension is undeformed. The stress-strain responses for these composite sandstone samples and two end-member components are shown in FIG. 10, below.

Figure 10:
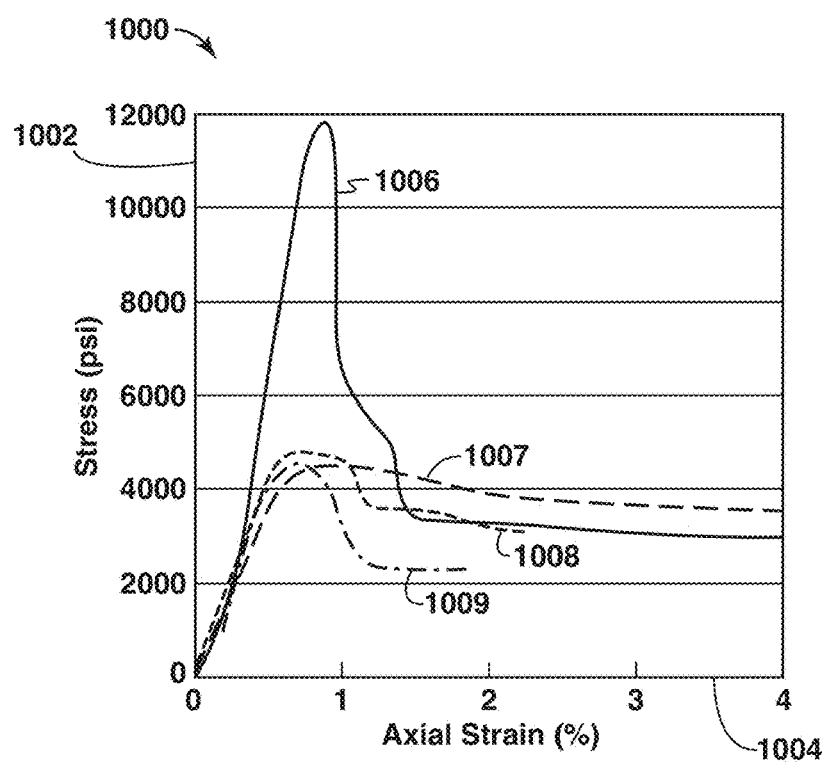
FIG. 10 is an exemplary graph of stress-strain curves for the sandstone samples, which include the concrete samples of FIG. 9.

FIG. 10 is an exemplary graph 1000 of stress-strain responses for the sandstone samples, which include the sandstone samples of FIG. 9. In the graph 1000, the responses 1006, 1007, 1008 and 1009 are shown along the stress axis 1002 in psi and the axial strain percentage (%) axis 1004. The response 1006 is the relationship for the strong sample (NGT), while the response 1009 is the relationship for the weak sample (WF). The response 1007 is the relationship for the composite that is ⅔ strong material and ⅓ weak material (e.g., the first sandstone sample of FIG. 9), while the response 1008 is the relationship for the ⅔ weak and ⅓ strong material (e.g., the second sandstone sample of FIG. 9). The two composite samples both have the similar strength as the weak end member. That is, the responses 1007 and 1008 show the behavior of the composite samples, which is similar to the behavior of the response 1009 for the weak sample. These responses do not indicate any contribution to the bulk strength from the strong end-member and imply that the Rankine-based layer averaging approach cannot be applied to this case.

For the two concrete numerical models, both with three layers each, all three layers failed and the strength was in-between the strength of the two materials so the upscaling methodology applied. For the two sandstone numerical models, only the weak material failed in shear and the strength of the composite was controlled by the weakest material. In this case, only one material failed so the assumption that each of the layers are deforming is not correct and the upscaling equations cannot be applied.

Further, numerical modeling of the four layered samples described above provides insight into the reasons for some of the differences between the sandstone samples and concrete samples, which are noted above. The numerical models provide insight into the process by which the layers fail. Under triaxial conditions, sample failure occurs as the weak layer fails and expands laterally. This deformation alters the stress state in the strong layer because the expansion occurring in the adjacent weak layers leads to a decrease in horizontal stress component $\sigma_3$, which thus allows failure to occur at a decreased vertical stress component $\sigma_1$. The failure of the weak layer promotes the failure of the strong layer. The opening mode failure in the strong end member observed in diagram 904 of FIG. 9 is evidence of this decrease in lateral stress. However, if the contrast in strength is too great, the failure of the adjacent weak layers does not alter the stress state enough to promote failure in the strong layer.

The contrast in strength between the weak and strong end-members is different for the concrete and sandstone material considered. The ratio of the peak stress (i.e. strength) reached by the two concrete end-members (lines 806 and 809) (e.g., about 0.60) is much larger than for the sandstones (lines 1006 and 1009) (e.g., about 0.37) and a low ratio means that there is a high contrast in the material strength. Under the same testing conditions, if the peak stress ratio is large, the layers fail as one material, but if the ratio is small, failure is focused into the weak layer. Because the strong sandstone layer was stronger than the weak sandstone layer, combined failure could not occur, but the relative parity in strength of the concretes resulted in failure of both weak and strong layers. This highlights the importance of separating weak and strong layers into their own mechanical units if the strength contrast is large.

Additionally, besides clarifying the effect of the peak stress ratio, numerical models show that numerical models, which have the same material end-members along with different numbers of layers and aspect ratios, can have very different patterns of deformation. In particular, the finite element models 402, 404, 406, 408 and 410 in FIG. 4 are axisymmetric models with a line of symmetry on the left hand side of each model shown (e.g., only half the plug is shown) with layers of WF and NGT sandstone. All models 402, 404, 406, 408 and 410 are ⅓ weak material and ⅔ strong material. It is evident that even though each of these models 402, 404, 406, 408 and 410 have the same material contrast and the same volumetric proportions of the strong and weak material components, the deformation characteristics appear very different. When there are only three layers and a 2:1 sample aspect ratio (e.g., model 402), the deformation is confined to the weak layer as seen in the laboratory testing in diagram 902 of FIG. 9. However, as the number of layers increases the deformation becomes more evenly distributed throughout the sample. The bulk strength exhibited by the model 402 in FIG. 4 is that of the weak end-member, and the bulk strength of the models 406 and 408 of FIG. 4 conforms to that of the averaging theory outlined noted above. The strength of the model 404 in FIG. 4 is transitional.

Additionally, a comparison of model 402 with model 410 shows that it is not simply the number of layers that affects the characteristics of the deformation, but rather the ratio of the layer thickness to the horizontal length scale of the modeled domain. One of the original assumptions of Salamon, which is cited above, was that the scale of the system is large compared to the layer thickness. It is apparent that this assumption is useful for plastic as well as elastic upscaling. The ratio of the layer thickness to lateral length scale (i.e. the horizontal aspect ratio, HAR) is the same in models 406 and 410 of FIG. 4, but the length scale of the model domain is quite different. An examination of the distribution of plastic deformation in the three layers of the model 410 and the three layers highlighted by the dashed box 412 in FIG. 4 shows that there are only minor differences. Thus, it is the ratio of the layer thickness to the horizontal length scale that is controlling the deformation characteristics and not the number of layers in the model.

Figure 11:
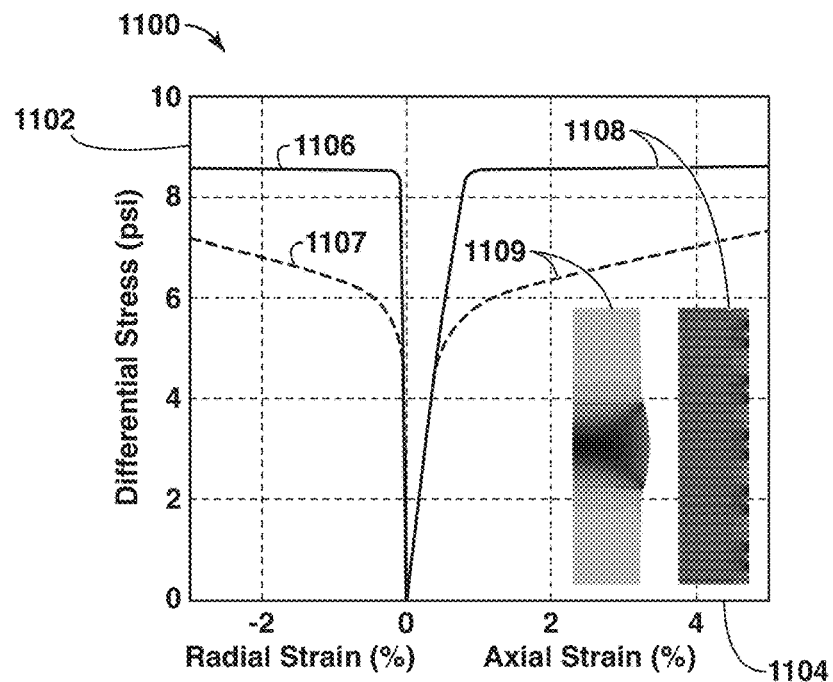
FIG. 11 is a graph of stress-strain responses for models with the same lateral length scale, but different HAR.

HAR influences the qualitative characteristics of the deformation, and it also plays a role in determining the strength of the composite specimen. As an example, FIG. 11 is a graph of stress-strain responses for models with the same lateral length scale, but different HAR. In the graph, the responses 1106 and 1107 are shown along the along the differential stress axis 1102 in psi and the strain axis 1104, which differentiates from radial strain percentage (%) and axial strain percentage (%) relative to a zero point along the strain axis 1104. Images of the plastic strain from the numerical models that generated these curves are 1108 and 1109. The stress-strain responses 1106 and 1107 can be substantially different depending on the HAR. For thick layers, the deformation is localized in the weak layer and the bulk material fails at a low stress. For thin layers, the strong and weak layers may deform together and the effective strength of the composite is stronger.

Accordingly, with only three layers and a large HAR, the model begins to fail at a low stress, but with a smaller HAR the bulk stress-strain response shows that the bulk strength is much stronger. This is because for large HAR the material behaves only as strong as the weakest layer, while for small HAR the bulk strength is an upscaled value based on both the strong and weak layers. This relationship is schematically shown in FIG. 12.

Figure 12:
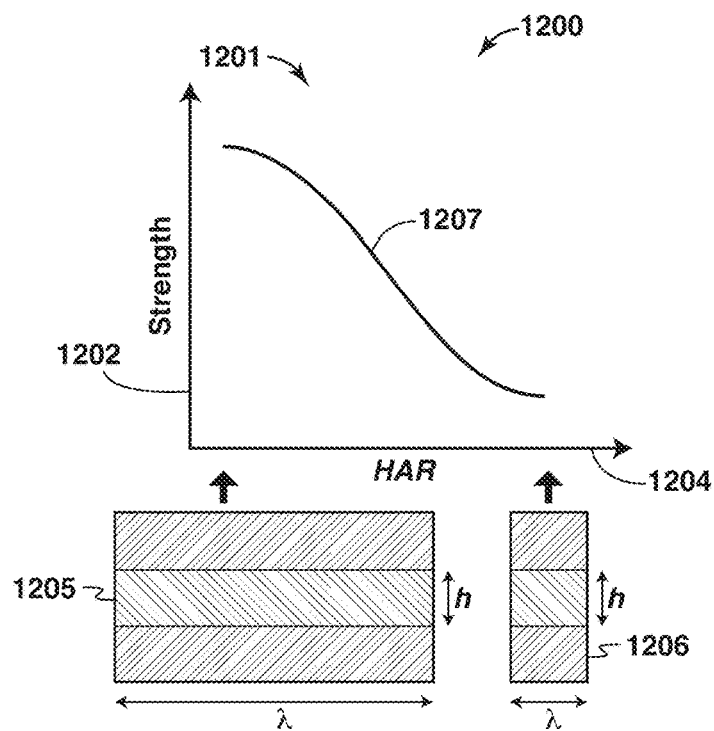
FIG. 12 is an exemplary diagram of a relationship between strength and HAR and a representation of small and large HAR.

FIG. 12 is an exemplary diagram 1200 of a relationship between a graph 1201 of strength versus HAR and a relationship of the different composite models 1205 and 1206. In the graph 1201, the response 1207 is shown along the along the strength axis 1202 in units of stress (psi) and the HAR axis 1204. The HAR is equal to the thickness of each layer (h) divided by the horizontal length scale of interest ($\lambda$). The resulting behavior is that models with large HAR, such as model 1206, appear weaker than models with a small HAR, such as model 1205 (assuming the same material contrast and confining pressure).

Numerical modeling results are similar to the laboratory measured composite strengths and indicate that the Rankine approach is valid when the peak stress ratio is large (low contrast) or when the layer thickness is small compared to the horizontal length scale of the domain. The above discussion is the basis for the specification of a horizontal length scale for use in the smoothing of the strength data. For larger length scales, the data can be smoothed more so that thin layers may be averaged into thicker layers.

Figure 13:
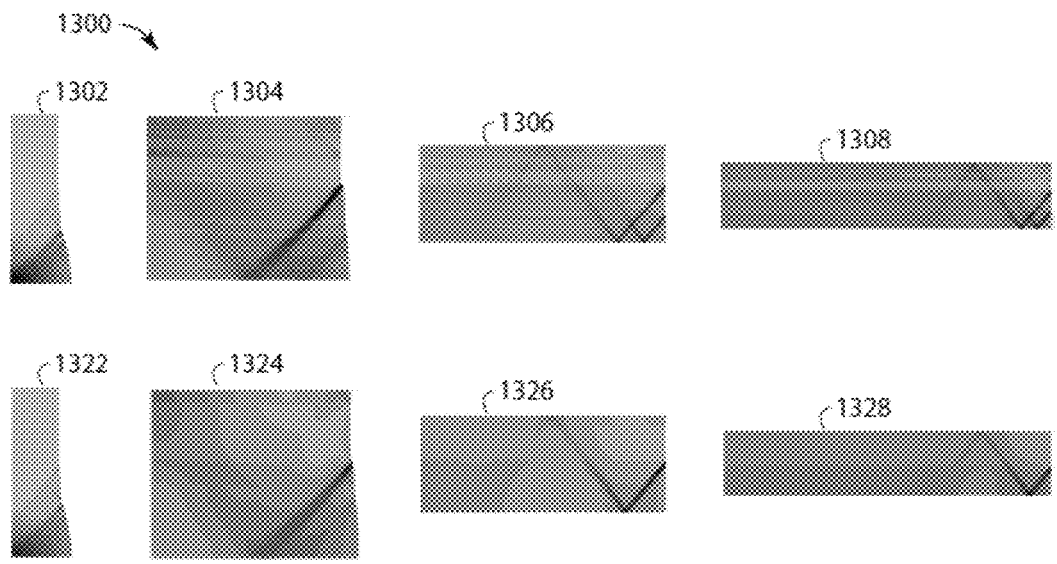
FIG. 13 is a set of models that compare plastic strain in a base model to upscaled axisymmetric numerical models of varying layers.

As an example of the present techniques, different numerical models may be compared to base models of higher resolution, which is noted in FIG. 13. FIG. 13 is a set of models that compare plastic strain in a base model to axisymmetric numerical models with varying numbers of layers. The comparison supports that the upscaled solution represents the material deformation.

In this set 1300 of models, the numerical models 1302, 1304, 1306 and 1308 contain rows of elements at log-resolution with mechanical properties specific to each row. These base models 1302, 1304, 1306 and 1308 have 394 layers. The 200 ft of continuous strength profile of FIGS. 2 and 3A to 3D is made from 394 data points. From each of these petrophysical measurements elastic and plastic properties are determined. The four numerical models 1302, 1304, 1306 and 1308 each have one layer with distinct mechanical properties for each of these measurements, but different horizontal length scales. That is, horizontal length scale of interest $\lambda$ include 50 ft, 100 ft, 500 ft and 1000 ft.

In this set 1300 of models, the numerical models 1322, 1324, 1326 and 1328 that contain one fourth the number of finite elements used for models 1302, 1304, 1306 and 1308. The model 1322 has nine layers, the model 1324 has five layers, the model 1326 has three layers and the model 1328 has two layers. Each model has a different number of layers with distinct mechanical properties based on the mechanical boundaries identified by the zero-crossings shown in FIG. 3A to 3D, respectively, which were filtered using a cutoff wavelength $\lambda_{cut}$ relevant for these length scales. The result is that rather than 394 layers, the four models have 9, 5, 3 or 2 layers depending on respective horizontal length scale of interest $\lambda$. Within each of the mechanical units identified, the strength and elastic properties are upscaled as described above.

For analysis, the plastic strain developed through simulation of 394 layers in models 1302, 1304, 1306 and 1308 is compared to the plastic strain generated from the upscaled geomechanical models 1322, 1324, 1326 and 1328, for each of the four length scales. The upscaled models 1322, 1324, 1326 and 1328 appear to capture first order characteristics of plastic deformation of the models 1302, 1304, 1306 and 1308 with a minimum number of layers and utilizing effective mechanical properties.

Figure 14:
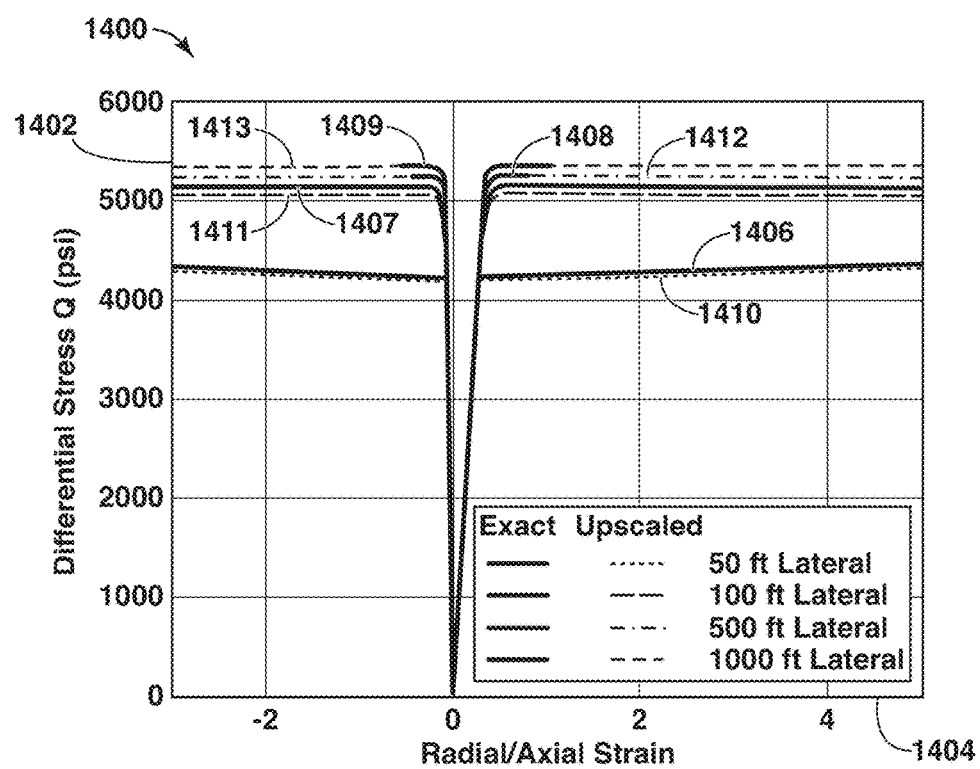
FIG. 14 is an exemplary graph of stress-strain responses for each of the models illustrated in FIG. 13.

FIG. 14 is an exemplary graph 1400 of associated stress-strain responses 1406 to 1413 for each of the models illustrated in FIG. 13. In the graph, the responses 1406 to 1413 are shown along the along the differential stress axis 1402 in psi and the strain axis 1404, which differentiates from radial strain percentage (%) and axial strain percentage (%) relative to a zero point along the strain axis 1404. The responses 1406 and 1410 are associated with the horizontal length scale of interest of 50 ft, while the response 1406 is associated with the base model (e.g., model 1302) and the response 1410 is associated with the upscaled model (e.g., model 1322). The responses 1407 and 1411 are associated with the horizontal length scale of interest of 100 ft, while the response 1407 is associated with the base model (e.g., model 1304) and the response 1411 is associated with the upscaled model (e.g., model 1324). The responses 1408 and 1412 are associated with the horizontal length scale of interest of 500 ft, while the response 1408 is associated with the base model (e.g., model 1306) and the response 1412 is associated with the upscaled model (e.g., model 1326). The responses 1409 and 1413 are associated with the horizontal length scale of interest of 1000 ft, while the response 1409 is associated with the base model (e.g., model 1308) and the response 1413 is associated with the upscaled model (e.g., model 1328).

In the graph 1400, the peak stresses for the different responses appear to be similar. In fact, near congruency is exhibited between each fine-scale responses 1406 to 1409 (associated with the base models) and coarse-scale responses 1410 to 1413 (associated with the upscaled models) model. Indeed, it is difficult to determine individual stress-strain responses for a given length scale. Also, evident from the graph 1400 is that the comparative weakness of the horizontal length scale of interest for $\lambda=50$ ft models (e.g., responses 1406 and 1410) compared to the other length scales. This is a result of the effective strength in this instance being controlled by the weakest layer, which is analogous to the composite sandstone sample shown in diagram 902 of FIG. 9. This result is expected and the fact that the upscaled model replicates this behavior illustrates the effectiveness of the approach.

Further, in one or more embodiments, the present techniques may be utilized to produce hydrocarbons from a subsurface region. This subsurface region may be represented by a subsurface model, which may include strength properties along an actual or proposed wellbore trajectory, which may be generated in accordance with the techniques noted above. For example, a method may include constructing a subsurface model via one or more of the various embodiments above. Then, the subsurface model may be utilized in hydrocarbon management activities to determine locations of resources, access the resources and produce hydrocarbons in a manner know to those skilled in the art. Disclosed aspects may be used in hydrocarbon management activities. As used herein, "hydrocarbon management" or "managing hydrocarbons" includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities. The term "hydrocarbon management" is also used for the injection or storage of hydrocarbons or $CO_2$, for example the sequestration of $CO_2$, such as reservoir evaluation, development planning, and reservoir management. In one embodiment, the disclosed methodologies and techniques may be used to extract hydrocarbons from a subsurface region. In such an embodiment, geophysical information is utilized to define a strength property volume (e.g., a geomechanical model or mechanical property volume), which may be referred to as a subsurface volume. Based at least in part on the strength properties in the subsurface volume, hydrocarbon extraction may then be conducted to remove hydrocarbons from the subsurface region, which may be accomplished by drilling a well using oil drilling equipment. The equipment and techniques used to drill a well and/or extract the hydrocarbons are well known by those skilled in the relevant art. Other hydrocarbon extraction activities and, more generally, other hydrocarbon management activities, may be performed according to known principles.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the present techniques are in no way limited to implementation in any specific operating system or environment.

As an example, a computer system may be utilized and configured to implement one or more of the present aspects. The computer system may include a plurality of processors; memory in communication with the processors; and a set of instructions stored on the memory and accessible by the processors, wherein the set of instructions, when executed, are configured to: examine petrophysical or cuttings data; generate strength properties based on said petrophysical or cuttings data; calculate strength using a representative confining stress; determine a lateral length scale; filter the strength data; shift the strength data to a specified mean value; compare the strength data to an arbitrary function; identify mechanical layer boundaries; edit the identified layer boundaries; determine upscaled elastic and plastic properties within each mechanical layer; update a subsurface model with upscaled values. In certain embodiments, the set of instructions may perform the different aspects in the methods noted above or the algorithm noted above.

Figure 15:
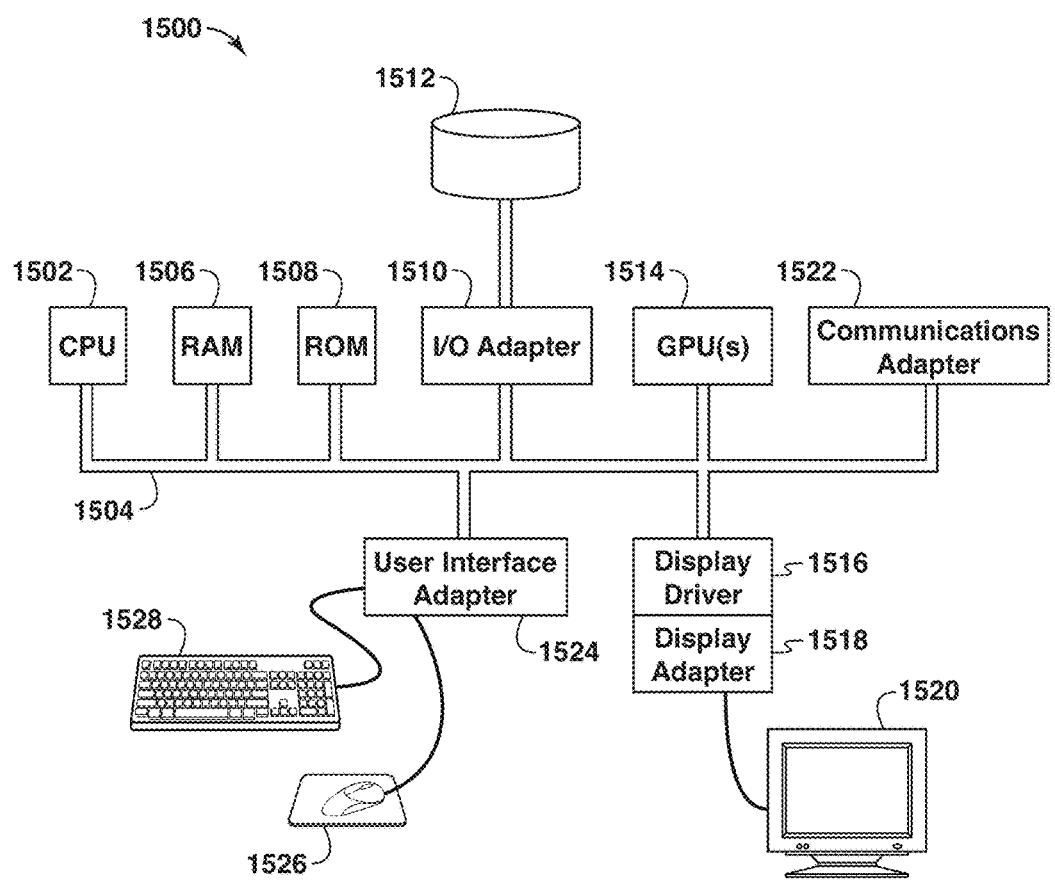
FIG. 15 is a block diagram of an exemplary computing system that may be used in exemplary embodiments of the present techniques.

As an example, the techniques discussed herein may be implemented on a computing device, such as that shown in FIG. 15. FIG. 15 shows an exemplary computer system 1500 on which software for performing processing operations of embodiments of the present techniques may be implemented. A central processing unit (CPU) 1502 is coupled to a system bus 1504. The CPU 1502 may be any general-purpose CPU. The present techniques are not restricted by the architecture of CPU 1502 (or other components of exemplary system 1500) as long as the CPU 1502 (and other components of system 1500) supports operations according to the techniques described herein.

The CPU 1502 may execute the various logical instructions according to the disclosed techniques. For example, the CPU 1502 may execute machine-level instructions for performing processing according to the exemplary operational flow described above. As a specific example, the CPU 1502 may execute machine-level instructions for performing at least the methods of FIG. 1.

The computer system 1500 may also include random access memory (RAM) 1506, which may be SRAM, DRAM, SDRAM, or the like. The computer system 1500 may include read-only memory (ROM) 1508 which may be PROM, EPROM, EEPROM, or the like. The RAM 1506 and the ROM 1508 hold user and system data and programs, as is well known in the art. The programs may include code stored on the RAM 1506 that may be used for modeling geologic properties with homogenized mixed finite elements, in accordance with embodiments of the present techniques.

The computer system 1500 may also include an input/output (I/O) adapter 1510, a communications adapter 1522, a user interface adapter 1524, and a display adapter 1518. The I/O adapter 1510, user interface adapter 1524, and/or communications adapter 1522 may, in certain embodiments, enable a user to interact with computer system 1500 to input information. Further, the computer system 1500 may also include a graphical processing unit (GPU(s)) to enhance the graphical processing of the computer system 1500.

The I/O adapter 1510 may connect the bus 1504 to storage device(s) 1512, such as one or more of hard drive, compact disc (CD) drive, floppy disk drive, tape drive, flash drives, USB connected storage, etc. to computer system 1500. The storage devices may be used when RAM 1506 is insufficient for the memory requirements associated with storing data for operations of embodiments of the present techniques. For example, the storage device 1512 of computer system 1500 may be used for storing such information as computational meshes, intermediate results and combined data sets, and/or other data used or generated in accordance with embodiments of the present techniques.

The communications adapter 1522 is adapted to couple the computer system 1500 to a network (not shown), which may enable information to be input to and/or output from the system 1500 via the network, for example, the Internet or other wide-area network, a local-area network, a public or private switched telephone network, a wireless network, or any combination of the foregoing. The user interface adapter 1524 couples user input devices, such as a keyboard 1528, a pointing device 1526, and a microphone (not shown) and/or output devices, such as speaker(s) (not shown) to computer system 1500. The display driver 1516 and display adapter 1518 are driven by the CPU 1502 to control the display on the display device 1520, for example, to display information pertaining to a target area under analysis, such as displaying a generated representation of the computational mesh, the reservoir, or the target area, according to certain embodiments.

The present techniques are not limited to the architecture of the computer system 1500 shown in FIG. 15. For example, any suitable processor-based device may be utilized for implementing all or a portion of embodiments of the present techniques, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may utilize any number of suitable structures capable of executing logical operations according to the embodiments. In one embodiment of the present techniques, the computer system may be a networked multi-processor system.

One or more of the following embodiments in the following paragraphs may be utilized with the processes, apparatus, and systems, provided above, to prepare a model and/or be utilized to produce hydrocarbons:

1. A method for modeling strength properties in subsurface formations comprising:
obtaining strength properties that are associated with a subsurface region;
determining a representative lateral length scale;
filtering the strength properties to smooth the strength properties, wherein the degree of smoothing is based on the representative lateral length scale;
determining mechanical layer boundaries, wherein a mechanical unit is bounded by two respective mechanical layer boundaries;
determining bulk strength properties for each of the mechanical units formed between respective mechanical layer boundaries by upscaling the strength properties within each of the mechanical units; and
creating a subsurface model based on the determined bulk strength properties.

2. The method of paragraph 1, wherein determining the representative lateral length scale comprises determining a model domain or a length scale of a feature of interest.

3. The method of any one of paragraphs 1 to 2, wherein obtaining the strength properties comprises calculating strength at each depth data point for a confining stress value and shifting the calculated strength data to have a zero mean 4. The method of paragraph 3, wherein calculating strength for a confining stress value comprises calculating a failure strength profile from predictions of friction angle and cohesion for the confining stress as a function of depth.

5. The method of any one of paragraphs 1 to 4, wherein filtering the strength properties comprises:
converting the strength properties into the Fourier domain; and
removing wavelengths below a threshold.

6. The method of any one of paragraphs 1 to 5, wherein filtering the strength properties comprises shifting the calculated strength data to have a zero mean; and wherein determining mechanical layer boundaries comprises identifying zero-crossings of the filtered strength properties.

7. The method of any one of paragraphs 1 to 6, wherein determining mechanical layer boundaries comprises identifying crossings of the filtered strength properties with an arbitrary function.

8. The method of any one of paragraphs 1 to 7, further comprising adjusting the mechanical layer boundaries to a nearby depth point or to reduce the number of mechanical units in the subsurface model.

9. The method of paragraph 8, wherein adjusting the mechanical layer boundaries to reduce the number of mechanical units in the subsurface model comprises removing mechanical units based on mechanical units within the subsurface model that have strength contrasts relative to neighboring mechanical units below a threshold.

10. The method of paragraph 9, wherein the threshold is determined by analysis of the amplitude of the filtered strength profile or the bulk strength properties between the mechanical layer boundaries.

11. The method of any one of paragraphs 1 to 10, wherein determining bulk strength properties for each of the mechanical units defined by the mechanical layer boundaries comprises upscaling the strength properties to equivalent bulk strength properties, wherein the bulk strength properties are calculated by single values for strength parameters.

12. The method of paragraph 11, wherein the strength parameters are friction angle and cohesion.

13. The method of any one of paragraphs 1 to 12, wherein the strength properties are generated from petrophysical data.

14. The method of any one of paragraphs 1 to 13, wherein the strength properties are determined from the analysis of well log data.

15. A system associated with the drilling of a wellbore comprising:
a processor;
memory coupled to the processor;
an application stored in the memory and configured to:
obtain strength properties that are associated with a subsurface region;
determine a representative lateral length scale;
filter the strength properties to smooth the strength data, wherein the degree of smoothing is based on the representative lateral length scale;
filter the strength properties to smooth the strength properties, wherein the degree of smoothing is based on the representative lateral length scale;
determine mechanical layer boundaries, wherein a mechanical unit is bounded by two respective mechanical layer boundaries;
determine bulk strength properties for each of the mechanical units formed between respective mechanical layer boundaries by upscaling the strength properties within each of the mechanical units; and
create a subsurface model based on the determined bulk strength properties; and
a monitor coupled to the processor and configured to present aspects of the anisotropic wellbore stability model.

16. The system of paragraph 15, wherein to determine the representative lateral length scale, the application is further configured to: determine a model domain or a length scale of a feature of interest.

17. The system of any one of paragraphs 15 to 16, wherein to obtain strength properties, the application is further configured to: calculate strength for a confining stress value and shift the calculated strength to have a zero mean.

18. The system of paragraph 17, wherein to calculate strength for a confining stress value, the application is further configured to: calculate a failure strength profile from predictions of friction angle and cohesion for the confining stress as a function of depth.

19. The system of any one of paragraphs 15 to 18, wherein to filter the strength properties, the application is further configured to:
converting the strength properties into the Fourier domain; and
removing wavelengths below a threshold.

20. The system of any one of paragraphs 15 to 19, wherein to determine mechanical layer boundaries, the application is further configured to:
shift the calculated strength data to have a zero mean; and
identify zero-crossings of the filtered strength properties.

21. The system of any one of paragraphs 15 to 20, wherein to determine mechanical layer boundaries, the application is further configured to identify crossings of the filtered strength properties with an arbitrary function.

22. The system of any one of paragraphs 15 to 21, wherein the application is further configured to adjust the mechanical layer boundaries to a nearby depth point or to reduce the number of mechanical units in the subsurface model.

23. The system of any one of paragraphs 15 to 22, wherein to adjust the mechanical layer boundaries, the application is further configured to: remove mechanical units based on identifying mechanical units within the subsurface model that have strength contrasts relative to neighboring mechanical units below a threshold.

24. The system of any one of paragraphs 15 to 24, wherein the application is further configured to determine the threshold by analysis of the amplitude of the filtered strength profile or the bulk strength properties between the mechanical layer boundaries.

25. The system of any one of paragraphs 15 to 24, wherein to determine bulk strength properties for each of the mechanical units defined by the mechanical layer boundaries, the application is further configured to upscale the strength properties to equivalent bulk strength properties, wherein the bulk strength properties are calculated by single values for strength parameters.

26. A method for producing hydrocarbons comprising:
obtaining strength properties that are associated with a subsurface region;
determining a representative lateral length scale;
filtering the strength properties to smooth the strength properties, wherein the degree of smoothing is based on the representative lateral length scale;
determining mechanical layer boundaries, wherein a mechanical unit is bounded by two respective mechanical layer boundaries;
determining bulk strength properties for each of the mechanical units formed between respective mechanical layer boundaries by upscaling the strength properties within each of the mechanical units; and creating a subsurface model based on the determined bulk strength properties; and producing hydrocarbons based on the subsurface model.

27. The method of paragraph 26 further comprising utilizing the subsurface model to develop a drilling plan.

28. The method of any one of paragraphs 26 to 27 further comprising utilizing the subsurface model to develop a production plan.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other. The articles "the", "a" and "an" are not necessarily limited to mean only one, but rather are inclusive and open ended so as to include, optionally, multiple such elements.

The invention claimed is:

1. A method for producing hydrocarbons comprising:
obtaining strength properties that are associated with a subsurface region, wherein obtaining the strength properties comprises calculating strength at each depth data point for a confining stress value and shifting the calculated strength data to have a zero mean;
determining a representative lateral length scale;
filtering the strength properties to smooth the strength properties, wherein the degree of smoothing is based on the representative lateral length scale;
determining mechanical layer boundaries, wherein a mechanical unit is bounded by two respective mechanical layer boundaries;
determining bulk strength properties for each of the mechanical units formed between respective mechanical layer boundaries by upscaling the strength properties within each of the mechanical units;
creating a subsurface model based on the determined bulk strength properties; and
producing hydrocarbons based on the subsurface model.

2. The method of claim 1, wherein determining the representative lateral length scale comprises determining a model domain or a length scale of a feature of interest.

3. The method of claim 1, wherein calculating strength for a confining stress value comprises calculating a failure strength profile from predictions of friction angle and cohesion for the confining stress as a function of depth.

4. The method of claim 1, wherein filtering the strength properties comprises:

converting the strength properties into the Fourier domain; and removing wavelengths below a threshold.

5. The method of claim 1, wherein filtering the strength properties comprises shifting the calculated strength data to have a zero mean; and wherein determining mechanical layer boundaries comprises identifying zero-crossings of the filtered strength properties.

6. The method of claim 1, wherein determining mechanical layer boundaries comprises identifying crossings of the filtered strength properties with an arbitrary function.

7. The method of claim 1, further comprising adjusting the mechanical layer boundaries to a nearby depth point or to reduce the number of mechanical units in the subsurface model.

8. The method of claim 7, wherein adjusting the mechanical layer boundaries to reduce the number of mechanical units in the subsurface model comprises removing mechanical units based on mechanical units within the subsurface model that have strength contrasts relative to neighboring mechanical units below a threshold.

9. The method of claim 8, wherein the threshold is determined by analysis of the amplitude of the filtered strength profile or the bulk strength properties between the mechanical layer boundaries.

10. The method of claim 1, wherein determining bulk strength properties for each of the mechanical units defined by the mechanical layer boundaries comprises upscaling the strength properties to equivalent bulk strength properties, wherein the bulk strength properties are calculated by single values for strength parameters.

11. The method of claim 10, wherein the strength parameters are friction angle and cohesion.

12. The method of claim 1, wherein the strength properties are generated from petrophysical data.

13. The method of claim 1, wherein the strength properties are determined from the analysis of well log data.

14. The method of claim 1 further comprising utilizing the subsurface model to develop a drilling plan.

15. The method of claim 1 further comprising utilizing the subsurface model to develop a production plan.

* * * * *